United States Patent [19]

Arakawa

[11] Patent Number: 4,630,238

[45] Date of Patent: Dec. 16, 1986

[54] SEMICONDUCTOR MEMORY DEVICE

[75] Inventor: Hideki Arakawa, Yokohama, Japan

[73] Assignee: Fujitsu Limited, Kanagawa, Japan

[21] Appl. No.: 659,191

[22] Filed: Oct. 9, 1984

[30] Foreign Application Priority Data

| Oct. 14, 1983 | [JP] | Japan | 58-191039 |
| Feb. 28, 1984 | [JP] | Japan | 59-035116 |
| Mar. 2, 1984 | [JP] | Japan | 59-038827 |
| Mar. 2, 1984 | [JP] | Japan | 59-038828 |
| Mar. 2, 1984 | [JP] | Japan | 59-038829 |
| Mar. 2, 1984 | [JP] | Japan | 59-038830 |
| Mar. 2, 1984 | [JP] | Japan | 59-038831 |
| Mar. 2, 1984 | [JP] | Japan | 59-038832 |

[51] Int. Cl.$^4$ ............................................. G11C 11/34
[52] U.S. Cl. ....................................... 365/185; 365/182
[58] Field of Search ....................... 365/182, 185, 228; 357/23.5

[56] References Cited

U.S. PATENT DOCUMENTS

| 4,300,212 | 11/1981 | Simko | 365/185 |
| 4,408,303 | 10/1983 | Guterman et al. | 365/185 X |
| 4,527,258 | 7/1985 | Guterman | 365/185 |

FOREIGN PATENT DOCUMENTS

| 55-101192 | 8/1980 | Japan . |
| 58-45697 | 3/1983 | Japan . |

Primary Examiner—Joseph A. Popek
Attorney, Agent, or Firm—Armstrong, Nikaido, Marmelstein & Kubovcik

[57] ABSTRACT

A semiconductor memory device including a nonvolatile random access memory cell constituted by a combination of a static random access memory cell or a dynamic random access memory cell and a floating circuit element, is disclosed.

In the device, the circuit constitution, the application of writing voltage, and the like, are improved. Thus, the number of the circuit elements, particularly the number of floating gate circuit elements, is reduced. As a result, the cell area can be decreased, high integration of the device can be increased. In addition, improvement of the circuit configuration increases the discretion allowed in the layout design, and the plurality of applications of the write voltage improves the storage efficiency.

25 Claims, 34 Drawing Figures

SEMICONDUCTOR MEMORY DEVICE

BACKGROUND OF THE INVENTION

1. Field of the Invention

The present invention relates to a semiconductor memory device, more particularly, it relates to a nonvolatile memory device constituted by combining a volatile memory cell and a nonvolatile memory cell including a floating gate circuit element.

2. Description of the Prior Art

Recently, in a static random access memory device (RAM), a volatile memory cell is combined with a floating gate circuit element to obtain a nonvolatile memory cell which is used to constitute a nonvolatile memory device. In a nonvolatile memory device of this type, the circuit configuration of each memory cell tends to be complex, and so the size of each memory cell tends to be large. However, this tendency leads to degradation in the reliability and integration of the memory device. In view of this problem, this tendency must be eliminated by a special circuit configuration or the like.

The prior art regarding this invention is disclosed in U.S. Pat. No. 4,300,212, and will be explained later in this text.

A primary object of the present invention is to provide a semiconductor memory device wherein the number of circuit elements is reduced, the area of a cell by which the device is constituted is reduced, high integration of the circuit is performed, and the number of tunnel capacitors which are the constituent elements are decreased, thereby increasing the production yield.

Another object of the present invention, is to increase the discretion of the layout design regarding the memory cell circuit.

Still another object of the present invention is to increase the storing efficiency by a plurality of write voltage applications.

According to the fundamental feature of the present invention, there is provided a semiconductor memory device comprising a volatile memory cell and a nonvolatile memory cell corresponding to the volatile memory cell, the nonvolatile memory cell comprising a transistor having a floating gate which turns on or off in response to the memorized data, a tunnel capacitor, with one electrode connected to the floating gate, a first write circuit connected to the other electrode of the tunnel capacitor, and a second write circuit capacitively coupled to one electrode of the tunnel capacitor. Either the first write circuit or the second write circuit supply a voltage for writing to the tunnel capacitor in response to the memorized data of the volatile memory cell, and electrons are injected into or emitted from the floating gate.

According to another feature of the present invention, there is provided a semiconductor memory device having a volatile memory cell and a nonvolatile memory cell corresponding to the volatile memory cell, wherein the nonvolatile memory cell comprises a tunnel capacitor with one electrode connected to a high-voltage control power source terminal, a first capacitor, with one electrode connected to the other electrode of the tunnel capacitor, a second capacitor connected between the other electrode of the first capacitor and the high-voltage control power source terminal, a transistor having a tunnel gate electrode with the gate connected to a common node between the tunnel capacitor and the first capacitor, and a switch means for controlling the potential at a common node between the first capacitor and the second capacitor in response to the memorized data of the volatile memory cell.

According to still another feature of the present invention, there is provided a semiconductor memory device having a volatile memory cell and a nonvolatile memory cell corresponding to the volatile memory cell, wherein the nonvolatile memory cell comprises a capacitor unit consisting of two series-connected tunnel capacitors, a series circuit of a first capacitor and a depletion-type or enhancement-type transistor connected between the common node of the two tunnel capacitors and a high-voltage control power source terminal, a transistor with the gate connected to the common node, and a switch means for controlling the potential of the gate of the depletion or enhancement-type transistor in response to the memorized data of the volatile memory.

According to still another feature of the present invention, there is provided a semiconductor memory device having a memory cell which comprises a pair of a volatile memory cell and a nonvolatile memory cell for saving the memorized data of the volatile memory cell, wherein the volatile memory cell comprises a capacitor portion for storing charges in response to data to be memorized, a transfer gate transistor connected between the capacitor and a bit line, a nonvolatile memory cell transistor having a double gate structure which has a control gate and a floating gate and in which electrons are injected by a tunnel effect, a recall transistor for transferring data stored in the nonvolatile memory cell transistor to the capacitor portion in response to a recall signal, a transistor turned on or off in response to the memorized data in the capacitor portion, a PGM transistor connected between the transistor turned on or off in response to the memorized data and the control gate, and a diode element connected to the control gate; wherein a first write voltage is applied to the control gate through the diode element, a second write voltage is applied to the drain of the nonvolatile memory cell transistor, and the PGM transistor is in a conductive state, whereby data of the volatile memory cell is written into the nonvolatile memory cell.

DESCRIPTION OF THE PREFERRED EMBODIMENTS

Prior to the description of the embodiments of the present invention, an explanation is given of the prior art.

Figure 1:
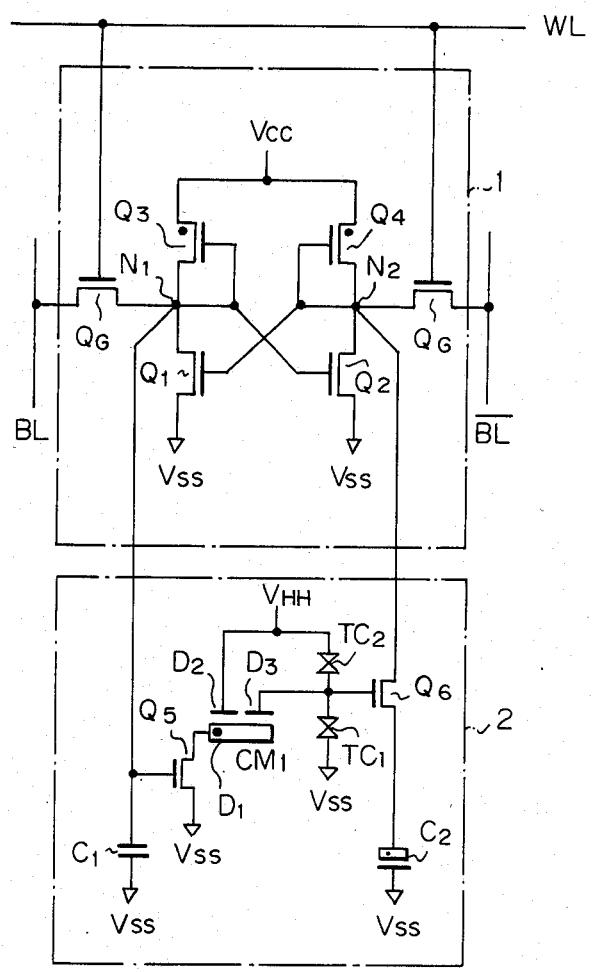
FIG. 1 shows a circuit diagram of a memory cell used in a conventional semiconductor memory device.

In FIG. 1, a memory cell used in a conventional nonvolatile memory device is shown. The memory cell in FIG. 1 comprises a volatile static memory cell portion 1 comprising MIS (metal insulator semiconductor) transistors $Q_1$, $Q_2$, $Q_3$, $Q_4$, and $Q_G$, and a nonvolatile memory cell portion 2 having a MIS transistor $Q_6$ with a floating gate and the like. The memory cell stores one-bit data. The nonvolatile memory cell portion 2 has, in addition to the MIS transistor $Q_6$, a MIS transistor $Q_5$, tunnel capacitors $TC_1$ and $TC_2$, a capacitor module $CM_1$, and capacitors $C_1$ and $C_2$. A capacitor which generates a tunnel effect by the application of a voltage between the electrodes thereof will be hereinafter called a tunnel capacitor.

In the circuit shown in FIG. 1, the static memory cell portion 1 has a flip-flop configuration which is ordinarily used in a conventional static RAM device. Data read/write is performed through a transfer gate transistor $Q_G$ connected to nodes $N_1$ and $N_2$. The nonvolatile memory cell portion 2 has a floating state wherein the circuit including the gate of the MIS transistor $Q_6$ floats from the other circuit components. Data is stored by injecting or not injecting electrons into this floating circuit. Therefore, a high-speed nonvolatile memory device can be realized with a transfer and a recall configuration; i.e., by transferring data of the static memory cell portion to the nonvolatile memory cell portion 2 before a power source $V_{CC}$ for the memory device is cut off and transferring the data from the nonvolatile memory cell portion 2 to the static memory cell portion 1 (recall) when the power source $V_{CC}$ is turned on.

Assuming that predetermined data is written in the static memory cell portion 1, the node $N_1$ is at low level ($V_{SS}$), and the node $N_2$ is at high level ($V_{CC}$). Thus, when the data of the static memory cell portion 1 is transferred to the nonvolatile memory cell portion 2 in this state, a control power source voltage $V_{HH}$ is usually boosted from 0 V to between 20 and 30 V. Since the node $N_1$ is at low level, the transistor $Q_5$ is cut off, and, since an electrode $D_1$ of the capacitor module $CM_1$ is floating, the gate of the transistor $Q_6$ is boosted to a high voltage due to capacitive coupling by boosting the power source voltage $V_{HH}$. Since a capacitance C ($D_1$, $D_2$) between the electrodes $D_1$ and $D_2$ of the capacitor module $CM_1$ and a capacitance C ($D_1$, $D_3$) between the electrodes $D_1$ and $D_3$ thereof are both sufficiently larger than the capacitances of the tunnel capacitors $TC_1$ and $TC_2$, the gate voltage of the transistor $Q_6$ is boosted to a voltage close to the power source voltage $V_{HH}$. A high voltage is then applied across the two ends of the tunnel capacitor $TC_1$. Electrons are injected into the floating gate of the transistor $Q_6$ from the power source $V_{SS}$ by the tunnel phenomenon, the floating gate is negatively charged, and the transistor $Q_6$ is cut off. This negative charge is held after the power sources $V_{CC}$ and $V_{HH}$ of the memory device are cut off, thereby achieving nonvolatile data storage.

In contrast to this, when the node $N_1$ of the static memory cell portion 1 is at high level and the node $N_2$ thereof is at low level, the transistor $Q_5$ is ON. Therefore, when the power source voltage $V_{HH}$ is boosted to, for example, 20 to 30 V, the electrode $D_1$ of the capacitor module $CM_1$ is kept at low level. A high voltage is then applied across the two ends of the tunnel capacitor $TC_2$. The tunnel phenomenon causes the electrons to be extracted from the side of the floating gate of the transistor $Q_6$ to the side of the power source $V_{HH}$. Thus, the floating gate is positively charged.

For example, the operation for transferring the data of the nonvolatile memory cell portion 2 to the volatile memory cell portion 1 upon power source on will be described below. First, of the power source voltages $V_{CC}$ and $V_{HH}$ at 0 V ($=V_{SS}$), the power source voltage $V_{CC}$ alone is boosted to, for example, 5 V. If electrons are stored in the floating gate of the transistor $Q_6$, the transistor $Q_6$ is cut off, and the conduction between the capacitor $C_2$ and the node $N_2$ is also cut off. Since the node $N_1$ is connected to the capacitor $C_1$, the flip-flop circuit of the volatile memory cell portion 1 is set so that the node $N_1$ having a larger load capacitance is at low level and the node $N_2$ is at high level when the power source voltage $V_{CC}$ is boosted. However, if the electrons are extracted from the floating gate of the transistor $Q_6$ and a positive charge is stored in the floating gate, the transistor $Q_6$ is turned on and the node $N_2$ and the capacitor $C_2$ are connected to each other. Since the capacitance of the capacitor $C_2$ is sufficiently larger than that of the capacitor $C_1$, the flip-flop circuit of the volatile memory cell portion 1 is set so that the node $N_2$ is set at low level and the node $N_1$ is set at high level when the power source voltage $V_{CC}$ is boosted. In this manner, the data is set in the volatile memory cell portion 1 in accordance with the charge stored in the floating gate of the transistor $Q_6$. When the circuit shown in FIG. 1 is used, a nonvolatile memory device can be realized.

However, in the conventional circuit shown in FIG. 1, two tunnel capacitors are used. In a tunnel capacitor, the thickness of the insulating film and the film quality must be controlled with high precision. Therefore, the manufacturing yield of the memory device is lowered.

Figure 2:
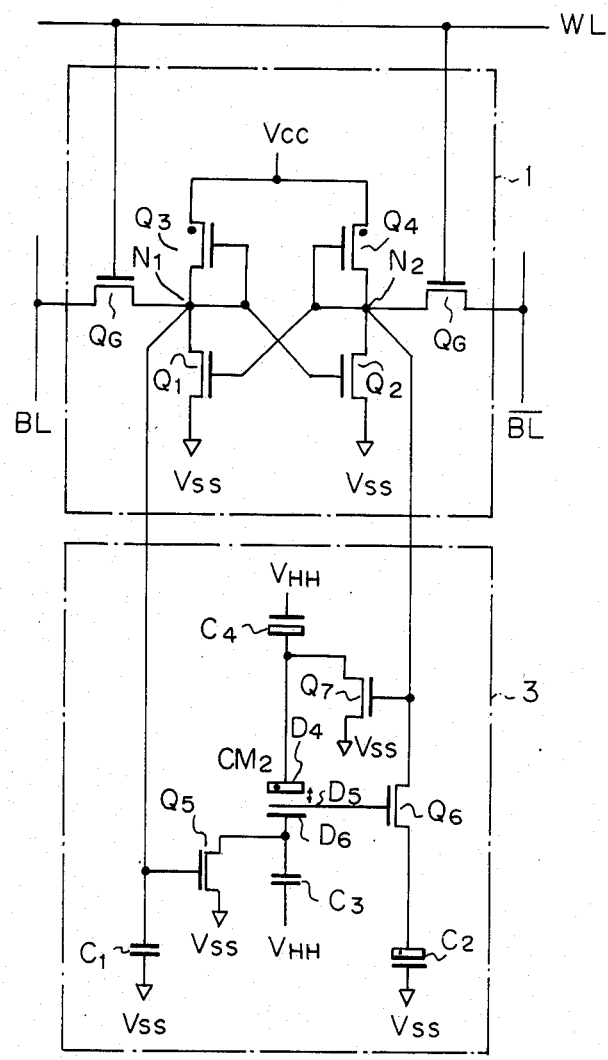
FIG. 2 shows a circuit diagram of a memory cell used in a semiconductor memory device according to a first embodiment of the present invention.

The preferred embodiments of the present invention will be now described with reference to the accompanying drawings. FIG. 2 shows an example of a memory cell used in a semiconductor memory device according to a first embodiment of the present invention. The memory cell has a volatile memory cell portion 1 the same as that in FIG. 1, and a nonvolatile memory cell portion 3 different from that shown in FIG. 1. The nonvolatile memory cell portion 3 comprises MIS transistors $Q_5$, $Q_6$, and $Q_7$, a capacitor module $CM_2$, and capacitors $C_1$, $C_2$, $C_3$, and $C_4$. The capacitor $C_4$ and the transistor $Q_7$ are included in a first write circuit, and the capacitor $C_3$ and transistor $Q_5$ are included in a second write circuit. The transistor $Q_7$ operates as a first switch means and the transistor $Q_5$ operates as a second switch means. The capacitor module $CM_2$ is formed by two electrodes $D_4$ and $D_6$ located both sides of an electrode $D_5$ through insulating films (not shown). The insulating film between the electrodes $D_4$ and $D_5$ is all or partially thin, having a thickness of, for example, 100 to 200 Å, and a tunnel capacitor is formed between the electrodes $D_4$ and $D_5$. The capacitance of the capacitor $C_2$ is larger than that of the capacitor $C_1$. The capacitances of the capacitors $C_3$ and $C_4$ and a capacitance C ($D_5$, $D_6$) between the electrodes $D_5$ and $D_6$ of the capacitor module $CM_2$ are sufficiently larger than a capacitance C ($D_4$, $D_5$) between the electrodes $D_4$ and $D_5$ of the capacitor module $CM_2$.

In the circuit shown in FIG. 2, an operation for transferring the data in the static memory cell portion 1 to the nonvolatile memory cell portion 3 will be described. Assuming that a flip-flop circuit of the static memory cell portion 1 is set so that a node $N_1$ is at low level and a node $N_2$ is at high level, therefore, in this state, a high-voltage control power sources voltage $V_{HH}$ is boosted from $V_{SS}$ (e.g., 0 V) to between 20 and 30 V. At this time, since the node $N_1$ is at low level, the transistor $Q_5$ is cut off. Since the node $N_2$ is at high level, the transistor $Q_7$ is in an ON state. Therefore, the potential at the electrode $D_4$ of the capacitor module $CM_2$ is at low level, and a control power source voltage $V_{HH}$ is applied to the series circuit of the capacitor $C_3$ and the capacitor module $CM_2$. As described above, since the capacitance of the capacitor $C_3$ and that between the electrodes $D_5$ and $D_6$ of the capacitor module $CM_2$ are sufficiently larger than that between the electrodes $D_4$ and $D_5$ of the capacitor module $CM_2$, most of the voltage of the power source $V_{HH}$ is applied to the capacitance between electrodes $D_4$ and $D_5$. Therefore, electrons are injected from the electrode $D_4$ to the electrode $D_5$ by the tunnel effect, a negative charge is stored in the floating gate of the transistor $Q_6$, the transistor $Q_6$ is turned off, and the data save from the volatile memory cell portion 1 to the nonvolatile memory cell portion 3 is completed.

When the node $N_1$ of the static memory cell portion 1 is at high level and the node $N_2$ is at low level, the transistor $Q_5$ is ON and the transistor $Q_7$ is OFF. Therefore, the power source voltage $V_{HH}$ is applied to the series circuit of the capacitor $C_4$ and the capacitor module $CM_2$. Due to the relationship between the capacitances of the respective capacitors, most of the voltage of the power source $V_{HH}$ is applied between the electrodes $D_4$ and $D_5$ of the capacitor module $CM_2$. In this case, unlike the case described above, a voltage is applied having a polarity such that the side of the electrode $D_4$ is higher in potential than the side of the electrode $D_5$. Therefore, the electrons of the floating gate circuit of the transistor $Q_6$ are extracted to the side of the electrode $D_4$ by the tunnel effect. Thus, the floating gate circuit is positively charged, the transistor $Q_6$ is turned on, and data save from the volatile memory cell portion 1 to the nonvolatile memory cell portion 3 is completed.

The operation for transferring the data in the nonvolatile memory cell portion 3 to the volatile memory cell portion 1 will be described. First, as in the circuit shown in FIG. 1, of the power source voltages $V_{CC}$ and $V_{HH}$, only the power source voltage $V_{CC}$ is boosted from 0 V to, for example, 5 V. At this time, if the floating gate circuit of the transistor $Q_6$ is negatively charged, the capacitor $C_2$ and the node $N_2$ are disconnected through the transistor $Q_6$. Since the node $N_1$ is connected to the capacitor $C_1$, when the power source voltage $V_{CC}$ is boosted, the flip-flop circuit of the volatile memory cell portion 1 is set so that the side of the node $N_1$ having a larger load capacitance is at low level and the side of the node $N_2$ is at high level. However, if electrons are extracted from the floating gate of the transistor $Q_6$ and the floating gate is positively charged, the transistor $Q_6$ is turned on and the node $N_2$ and the capacitor $C_2$ are connected to each other. As described above, since the capacitance of the capacitor $C_2$ is larger than that of the capacitor $C_1$, the flip-flop circuit of the volatile memory cell portion 1 is set so that the node $N_2$ is set at low level and the node $N_1$ is set at high level when the power source voltage $V_{CC}$ is boosted. In this manner, data corresponding to the charge on the floating gate of the transistor $Q_6$ is set in the volatile memory cell portion 1, thereby returning the data from the nonvolatile memory cell portion 3 to the volatile memory cell portion 1.

In the circuit shown in FIG. 2, since only a single tunnel capacitor is used, the manufacturing yield of the memory devices can be improved as compared to the conventional device.

Figure 3:
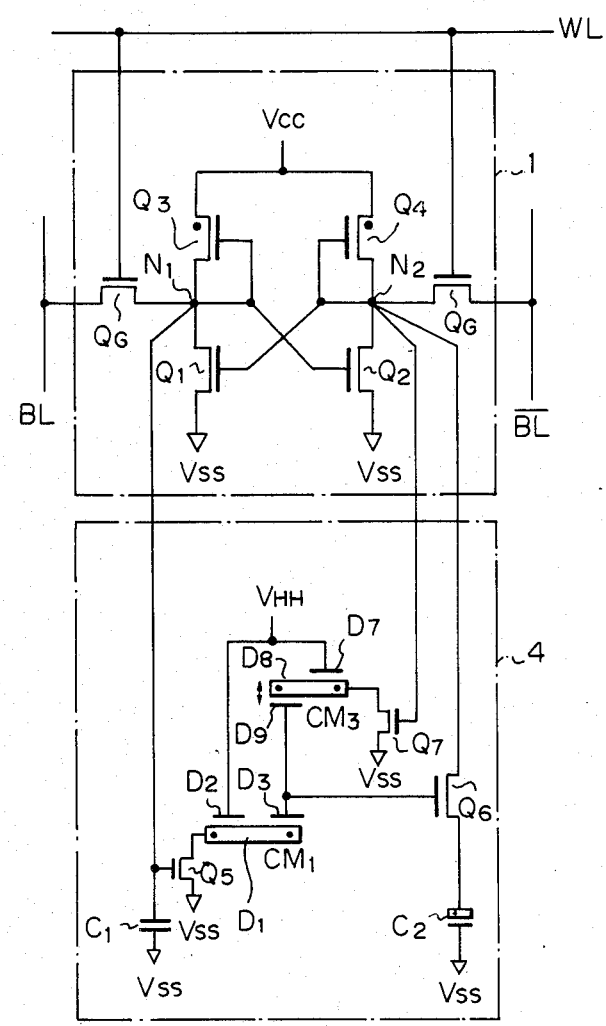
FIG. 3 shows a circuit diagram of a memory cell used in a semiconductor memory device according to a second embodiment of the present invention.

FIG. 3 shows the circuit configuration of a memory cell of a semiconductor memory device according to a second embodiment of the present invention. The memory cell shown in FIG. 3 is electrically equivalent to that shown in FIG. 2. However, the memory cell shown in FIG. 3 has two capacitor modules $CM_1$ and $CM_3$. The capacitor module $CM_1$ has three electrodes $D_1$, $D_2$, and $D_3$; of which the electrodes $D_1$ and $D_2$ constitute a capacitor $C_3$ shown in FIG. 2, and electrodes $D_1$ and $D_3$ constitute a capacitor corresponding to the capacitor constituted by the electrodes $D_5$ and $D_6$ of the capacitor module $CM_2$ shown in FIG. 2. The capacitor module $CM_3$ has three electrodes $D_7$, $D_8$, and $D_9$, of which the electrodes $D_7$ and $D_8$ constitute a capacitor corresponding to the capacitor $C_4$ shown in FIG. 2, and the electrodes $D_8$ and $D_9$ constitute a tunnel capacitor correponding to the tunnel capacitor constituted by the electrode $D_4$ and $D_5$ shown in FIG. 2. However, in the memory cell shown in FIG. 2, the capacitor module $CM_2$ must be formed of a conductive layer such as polycrystalline silicon (poly-Si) having a bilayered structure formed on a semiconductor substrate. However, in the memory cell shown in FIG. 3, the capacitor modules $CM_1$ and $CM_3$ can both be made of a single conductive layer. Therefore, the element structure can be rendered simpler. The other construction and operation of the cell shown in FIG. 3 are the same as those of the cell shown in FIG. 2 and will not be described.

Figure 4:
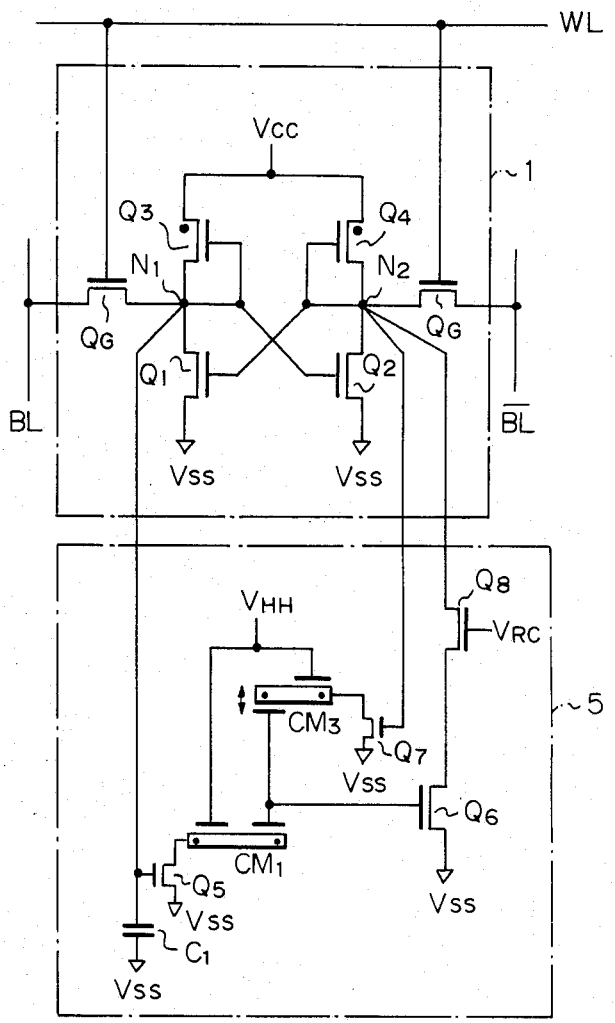
FIG. 4 shows a circuit diagram of a memory cell used in a semiconductor memory device according to a third embodiment of the present invention.

FIG. 4 shows the circuit configuration of a memory cell of a semiconductor memory device according to a third embodiment of the present invention. In the memory cell shown in FIG. 4, the capacitor $C_2$ of the memory cell shown in FIG. 3 is omitted, and a recall transistor $Q_8$ is inserted between a node $N_2$ of a volatile memory cell portion 1 and the drain of a transistor $Q_6$. The remaining portions of the cell shown in FIG. 4 are the same as those of the cell shown in FIG. 3, and are designated by the same reference numerals.

In the circuit shown in FIG. 4, the transistor $Q_8$ is turned on for a short period of time when data of a nonvolatile memory cell portion 5 is transferred to the volatile memory cell portion 1. A recall voltage $V_{RC}$ is applied to the gate of the transistor $Q_8$ when a power source $V_{CC}$ is turned on. When data is transferred from the nonvolatile memory cell portion 5 to the volatile memory cell portion 1, if the floating gate circuit of the transistor $Q_6$ is positively charged and the transistor $Q_6$ is turned on, the transistor $Q_8$ is turned on for a short period of time to maintain the voltage of node $N_2$ at 0 V ($=V_{SS}$). With this operation, without using the recall capacitor $C_2$, the data of the nonvolatile memory cell portion can be transferred to the volatile memory cell portion 1, and the area of the memory cells on a semiconductor substrate can be reduced to a minimum. In the memory cell shown in FIG. 4, when the recall transistor $Q_8$ is cut off, the drain voltage of the transistor $Q_6$ is at low level ($V_{SS}$). Therefore, hot electrons will not be injected from the drain to the gate, and fluctuations in the charge amount of the floating gate circuit are prevented, so that data can be held stably for a long period of time.

Figure 5:
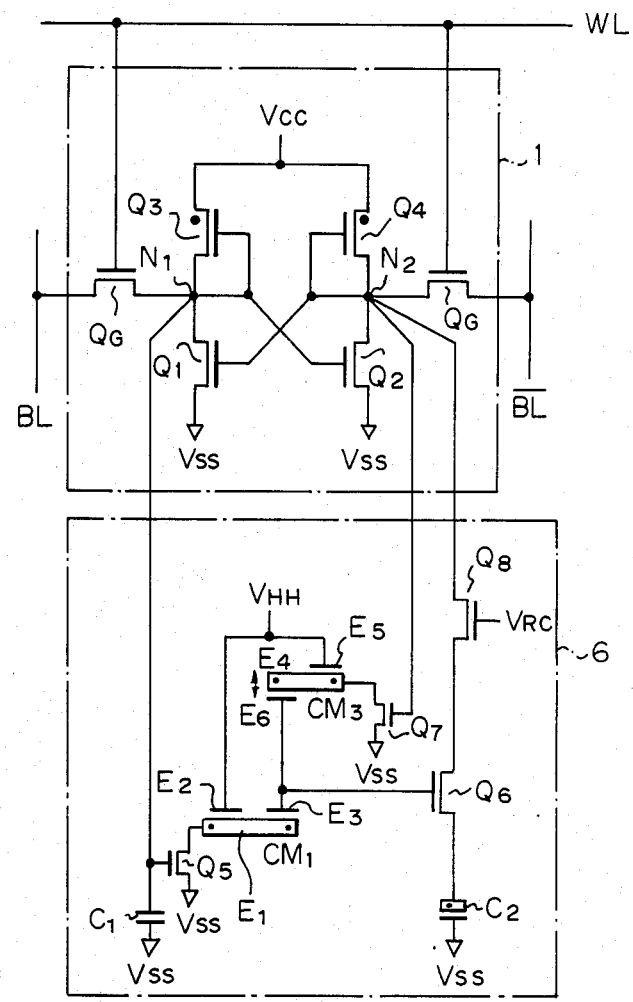
FIG. 5 shows a circuit diagram of a memory cell used in a semiconductor memory device according to a fourth embodiment of the present invention.

FIG. 5 shows the circuit configuration of a memory cell of a semiconductor memory device according to a fourth embodiment of the present invention. The memory cell shown in FIG. 5 is obtained by loading a recall capacitor $C_2$ to the memory cell shown in FIG. 4. The remaining portions of the cell shown in FIG. 5 are the same as those of the cell shown in FIG. 4 and are designated by the same reference numerals. In the memory cell shown in FIG. 5, the recall capacitor $C_2$ and a recall transistor $Q_8$ are both used. Therefore, the area in the nonvolatile memory cell portion cannot be reduced. However, since the recall transistor $Q_8$ is used, fluctuations in the amount of charge on the floating gate of the transistor $Q_6$ are reduced as in the cell shown in FIG. 4, and data can be stably held for a long period of time.

Figure 6:
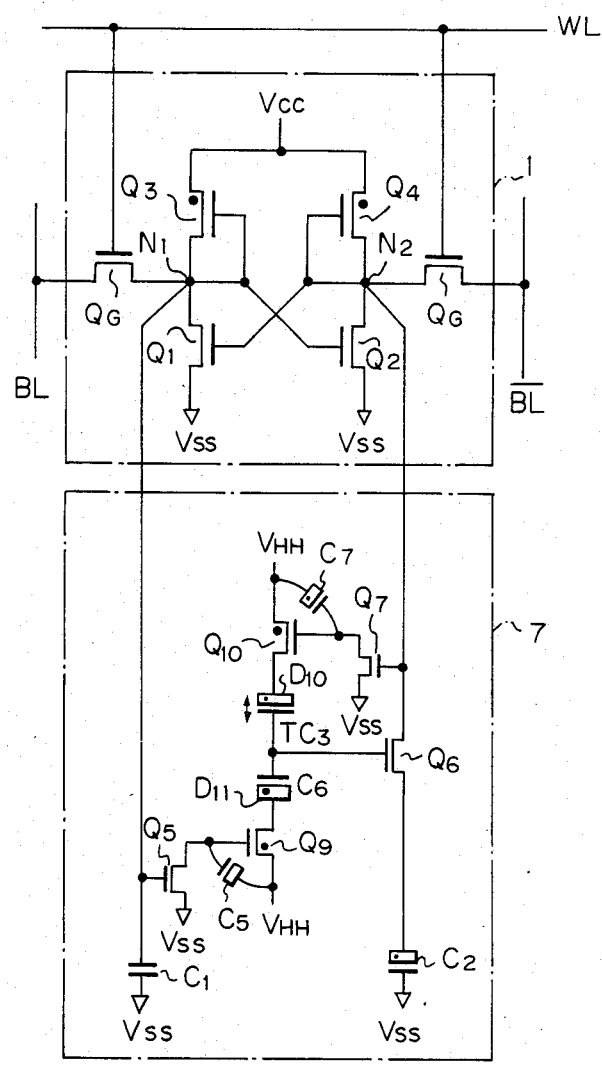
FIG. 6 shows a circuit diagram of a memory cell used in a semiconductor memory device according to a fifth embodiment of the present invention.

FIG. 6 shows the circuit configuration of a memory cell of a semiconductor memory device according to a fifth embodiment of the present invention. The memory cell shown in FIG. 6 has a volatile memory cell portion 1 and a nonvolatile memory cell portion 7, and the volatile memory cell portion 1 is the same as that in each embodiment described above. The nonvolatile memory portion 7 has enhancement-type MIS transistors $Q_5$, $Q_6$, and $Q_7$, depletion-type or enhancement-type transistors $Q_9$ and $Q_{10}$, capacitors $C_1$, $C_2$, $C_5$, $C_6$, and $C_7$, and a single tunnel capacitor $TC_3$.

In the circuit shown in FIG. 6, when data is saved from the volatile memory cell portion 1 to the nonvolatile memory cell portion 7, a high-voltage control power source voltage $V_{HH}$ is boosted to a high level. If a node $N_1$ of the volatile memory cell portion 1 is at high level and a node $N_2$ is at low level, the transistor $Q_5$ is ON and the transistor $Q_7$ is OFF. Therefore, if the power source voltage $V_{HH}$ is boosted, the gate voltage of the transistor $Q_9$ is not boosted but the gate voltage of the transistor $Q_{10}$ is temporarily boosted by the operation of the capacitor 7. Therefore, the potential at an electrode $D_{10}$ of the tunnel capacitor $TC_3$ is boosted to be closer to the voltage of the power source $V_{HH}$. However, since the gate voltage of the transistor $Q_9$ is not boosted, the potential at an electrode $D_{11}$ of the capacitor $C_6$ receives only a small boost. Therefore, although a voltage close to the power source voltage $V_{HH}$ is applied to the series circuit having the tunnel capacitor $TC_3$, it is mostly applied to the tunnel capacitor $TC_3$ since the capacitance of the capacitor $C_6$ is sufficiently larger than that of the tunnel capacitor $TC_3$ and the capacitor $C_6$. Therefore, electrons are extracted from the side of the floating gate circuit of the tunnel capacitor $TC_3$ toward the side of the electrode $D_{10}$, and the floating gate circuit is positively charged.

In contrast to this, when the node $N_1$ of the volatile memory cell portion 1 is at low level and the node $N_2$ is at high level, the transistor $Q_7$ is turned on and the transistor $Q_5$ is turned off. Therefore, in accordance with a similar operation to that described above, a voltage close to the power source voltage $V_{HH}$ is applied to the side of an electrode $D_{11}$ of the capacitor $C_6$, and a low level voltage (e.g., 1 to 2 V when the transistors $Q_9$ and $Q_{10}$ are depletion type) only is applied to the side of the electrode $D_{10}$ of the tunnel capacitor $TC_3$. The electrons are then injected from the side of the electrode $D_{10}$ of the tunnel capacitor $TC_3$ to the floating gate circuit side.

Figure 7:
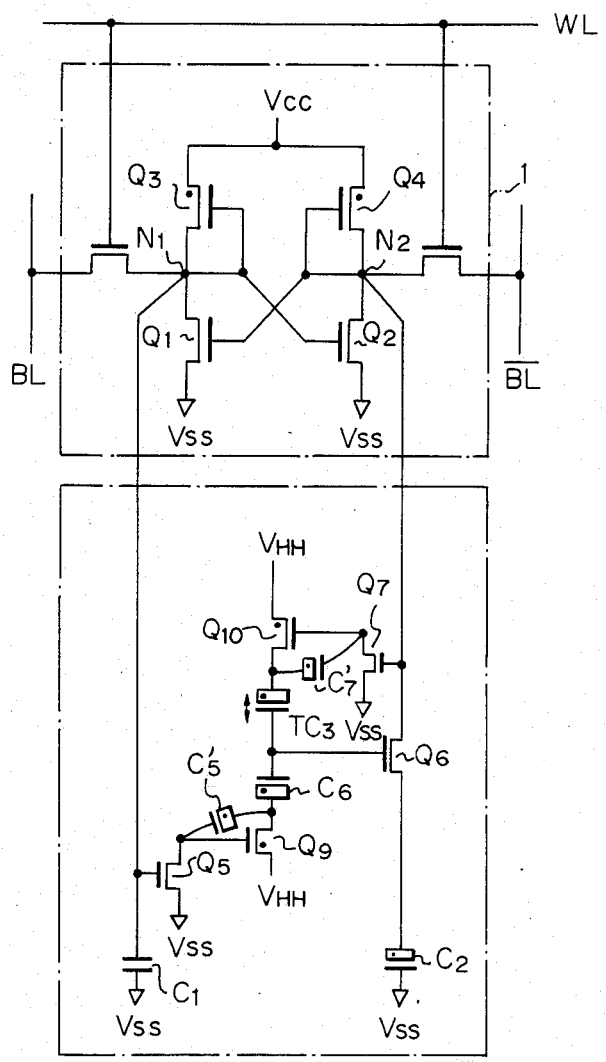
FIG. 7 shows a circuit diagram of a memory cell as a modification of the memory cell in FIG. 6.

Since the operation for transferring data from the nonvolatile memory cell portion 7 to the volatile memory cell portion 1 is the same as in the earlier embodiments, it will not be described. When the transistors $Q_9$ and $Q_{10}$ are depletion-type, the circuit configuration shown in FIG. 7 can be adopted.

Figure 8:
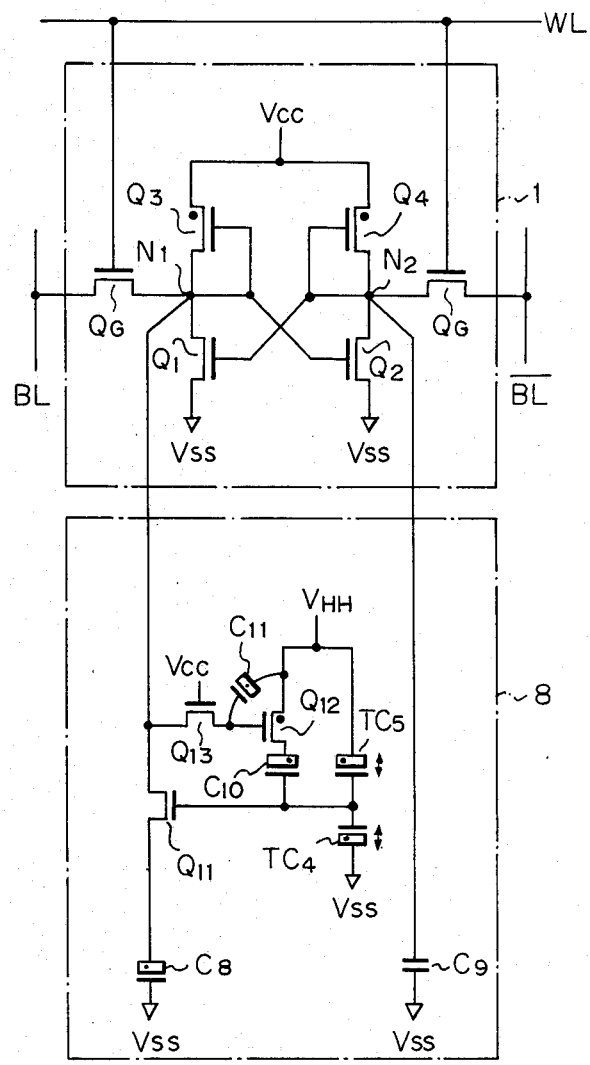
FIG. 8 shows a circuit diagram of a memory cell used in a semiconductor memory device according to a sixth embodiment of the present invention.

FIG. 8 shows the circuit configuration of a memory cell of a semiconductor memory device according to a sixth embodiment of the present invention. A nonvolatile memory cell portion 8 of this memory cell comprises enhancement-type transistors $Q_{11}$ and $Q_{13}$, a depletion-type or enhancement-type transistor $Q_{12}$, capacitors $C_8$, $C_9$, $C_{10}$, and $C_{11}$, tunnel capacitors $TC_4$ and $TC_5$, and the like.

In the memory cell shown in FIG. 8, when data of a volatile memory cell portion 1 is to be stored in the nonvolatile memory cell portion 8, a high-voltage control power source voltage $V_{HH}$ is boosted to a high level while a power source voltage $V_{CC}$ is applied. If a node $N_1$ of the volatile memory cell portion 1 is at high level and a node $N_2$ thereof is at low level, the gate and drain (node $N_1$) of the transistor $Q_{13}$ are at level $V_{CC}$, and the source is at level $V_{CC} - V_{th}$ (where $V_{th}$ is a threshold voltage of the transistor $Q_{13}$). Therefore, when the voltage $V_{HH}$ is boosted, the gate voltage of the transistor $Q_{12}$ is also boosted by means of the capacitor $C_{11}$. However, in this case, the transistor $Q_{13}$ is cut off, and the gate voltage of the transistor $Q_{12}$ is boosted substantially to $V_{HH}$. Then, the voltage of the power source $V_{HH}$ is applied to the capacitor $C_{10}$ and the tunnel capacitor $TC_4$ through the transistor $Q_{12}$. Since the capacitance of the capacitor $C_{10}$ is sufficiently larger than the capacitance of the tunnel capacitor $TC_4$, the voltage is mostly applied to the tunnel capacitor $TC_4$. Therefore, electrons are injected into the floating gate circuit of the transistor $Q_{11}$ through the tunnel capacitor $TC_4$ by the tunnel effect, and the floating gate circuit is negatively charged.

In contrast to this, when the node $N_1$ of the volatile memory cell portion 1 is at low level and the node $N_2$ thereof is at high level, the gate voltage of the depletion-type transistor $Q_{12}$ is at low level. When the power source voltage $V_{HH}$ is boosted to a high voltage, the charge on the capacitor $C_{11}$ serves to boost the gate voltage of the transistor $Q_{12}$. However, since the transistor $Q_{13}$ is ON, the charge is extracted to the side of the node $N_1$. Therefore, the gate of the transistor $Q_{12}$ is kept at low level (0 V), and a high voltage is not applied to the capacitor $C_{10}$. Most of the voltage $V_{HH}$ is applied to the tunnel capacitor $TC_5$. Electrons are extracted from the floating gate circuit of the transistor $Q_{11}$ by the tunnel effect, and the floating gate circuit is positively charged.

The operation for transferring the data from the nonvolatile memory cell portion 8 to the volatile memory cell portion 1 is the same as that of the earlier embodiments and will not be described.

Figure 9:
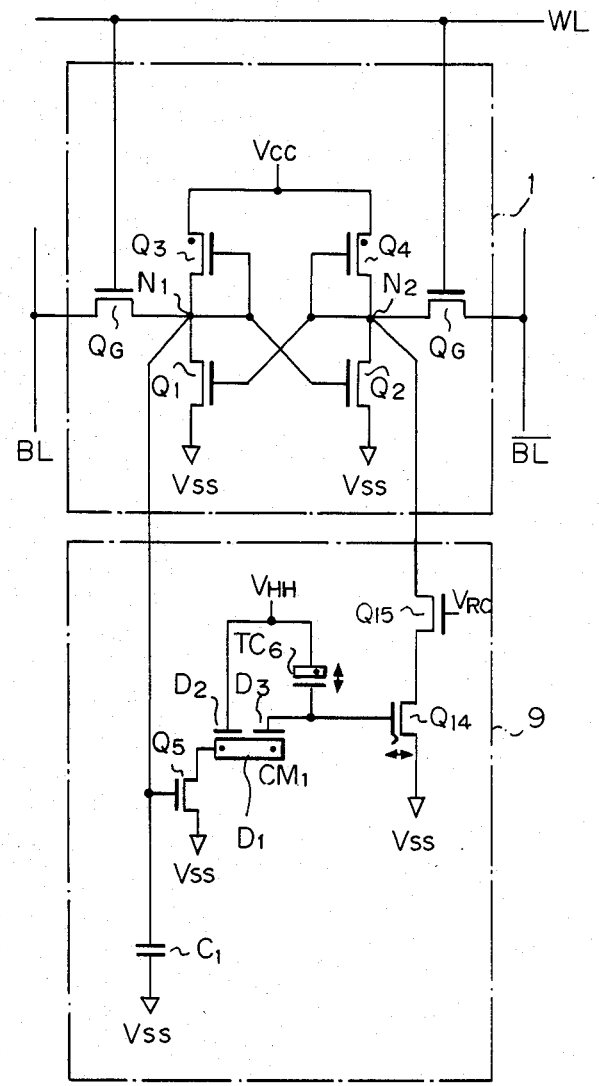
FIG. 9 shows a circuit diagram of a memory cell used in a semiconductor memory device according to a seventh embodiment of the present invention.

FIG. 9 shows the circuit configuration of a memory cell of a semiconductor memory device according to a seventh embodiment of the present invention. A nonvolatile memory cell portion 9 of this memory cell has MIS transistors $Q_5$, $Q_{14}$, and $Q_{15}$, a capacitor $C_1$, a capacitor module $CM_1$, and a tunnel capacitor $TC_6$. The transistor $Q_{14}$ partially has a thin gate insulating film of a 100 to 200 Å thickness and also serves as a tunnel capacitor.

In the memory cell shown in FIG. 9, when data is saved from the volatile memory cell portion 1 to the nonvolatile memory cell portion 9, if a node $N_1$ is at high level and a node $N_2$ is at low level, the transistor $Q_5$ is ON. When a high-voltage control power source voltage $V_{HH}$ is boosted to a high level in this state, the high level voltage is applied to the series circuit of the tunnel capacitor $TC_6$ and the capacitor constituted by electrodes $D_1$ and $D_3$ of the capacitor module $CM_1$. When it is assumed that a capacitance between the electrodes $D_1$ and $D_3$ of the capacitor module $CM_1$ is sufficiently larger than that of the tunnel capacitor $TC_6$, most of the power source voltage $V_{HH}$ is applied to the tunnel capacitor $TC_6$. Therefore, electrons are extracted from the floating gate circuit of the transistor $Q_{14}$ by the tunnel effect, and the floating gate circuit is positively charged.

However, when the node $N_1$ is at low level and the node $N_2$ is at high level, the transistor $Q_5$ is OFF. When the power source voltage $V_{HH}$ is boosted, the floating gate circuit of the transistor $Q_{14}$ is boosted to a high voltage. Then, electrons are injected into the floating gate circuit through a tunnel capacitor constituted by the gate electrode of the transistor $Q_{14}$ and the semiconductor substrate, and the floating gate circuit is negatively charged.

The mode of operation for transferring the data from the nonvolatile memory cell portion 9 to the volatile memory cell portion 1 can be easily deduced from the description of the earlier embodiments, and will not be described.

Figure 10:
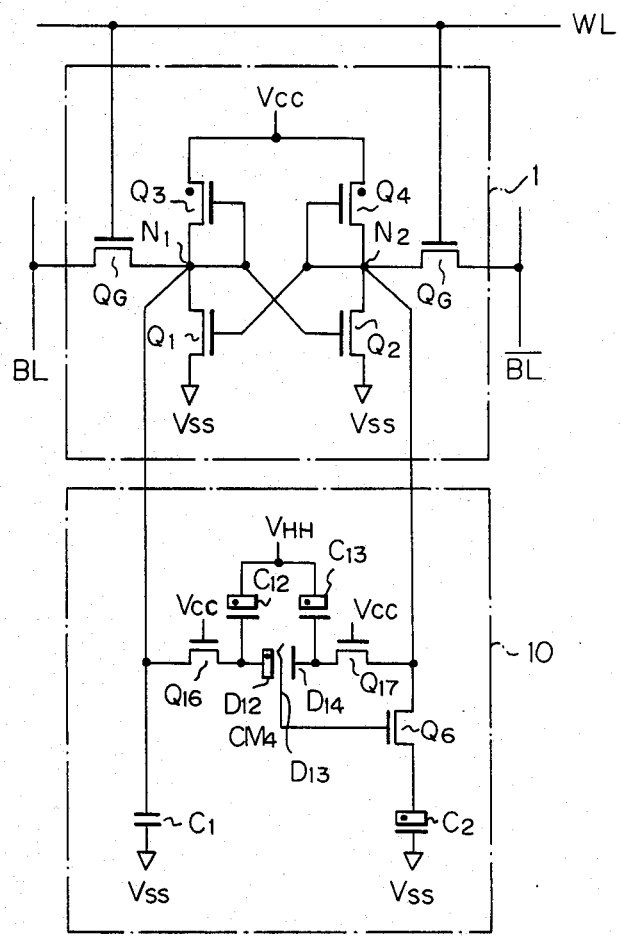
FIG. 10 shows a circuit diagram of a memory cell used in a semiconductor memory device according to an eighth embodiment of the present invention.

FIG. 10 shows the circuit configuration of a memory cell of a semiconductor memory device according to an eighth embodiment of the present invention. A nonvolatile memory cell portion 10 of the memory cell shown in FIG. 10 has MIS transistors $Q_6$, $Q_{15}$, and $Q_{16}$, capacitors $C_1$, $C_2$, $C_{12}$, and $C_{13}$, and a capacitor module $CM_4$. As in the case of the capacitor module $CM_2$ in FIG. 2, the capacitor module $CM_4$ has a tunnel capacitor between electrodes $D_{12}$ and $D_{13}$ and a normal capacitor between electrodes $D_{13}$ and $D_{14}$.

In the memory cell shown in FIG. 10, when data is saved from the volatile memory cell portion 1 to the nonvolatile memory cell portion 10, it is assumed that a node $N_1$ is at high level and a node $N_2$ is at low level. Then, when a high-voltage control power source $V_{HH}$ is boosted to a high level under the application of a power source voltage $V_{CC}$, the side of the electrode $D_{12}$ of the capacitor module $CM_4$ is boosted to a high level voltage by capacitor 12, while the electrode $D_{14}$ is held at low level. Then, electrons are extracted from the electrode $D_{13}$ to the electrode $D_{12}$, and the floating gate circuit of the transistor $Q_6$ is positively charged. However, when the node $N_1$ is at low level and the node $N_2$ is at high level, electrons are injected from the electrode $D_{12}$ to the electrode $D_{13}$, and the floating gate circuit is negatively charged. The mode of operation for transferring the data from the nonvolatile memory cell portion 10 to the volatile memory cell portion 1 can be easily deduced from the description of the earlier embodiments, and will not be described.

Figure 11:
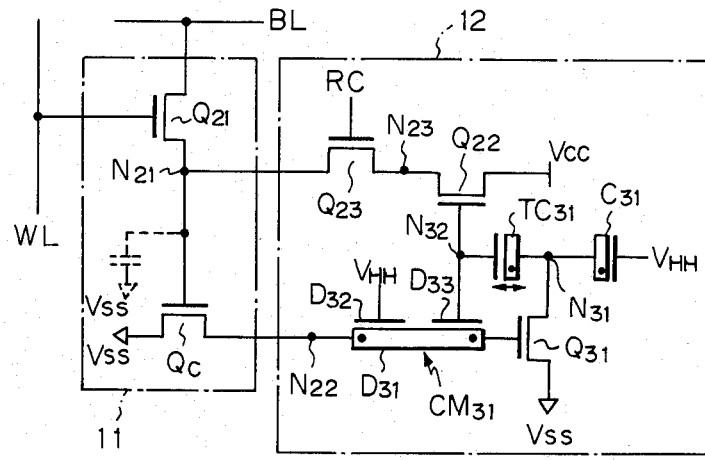
FIG. 11 shows a circuit diagram of a memory cell used in a semiconductor memory device according to a ninth embodiment of the present invention.

A memory cell of a semiconductor memory device according to a ninth embodiment of the present invention is shown in FIG. 11. The memory cell has a volatile dynamic memory cell 11 and a nonvolatile memory cell portion 12. The volatile dynamic memory cell 11 consists of a transfer transistor $Q_{21}$ and another transistor $Q_C$. The gate capacitance of the transistor $Q_C$ constitutes a capacitor portion of this memory cell, so that data is stored in this capacitor portion of the volatile dynamic memory cell 11. A separate capacitor can be alternatively provided in place of the capacitor portion, as indicated by a dotted line. The drain of the transistor $Q_{21}$ is connected to a bit line BL, and the source thereof is connected to the gate of the transistor $Q_C$. The gate of the transistor $Q_{21}$ is connected to a word line WL. The source of the transistor $Q_C$ is connected to a power source $V_{SS}$ (normally at 0 V). A connecting point of the source of the transistor $Q_{21}$ and the gate of the transistor $Q_C$ is designated as a node $N_{21}$.

The nonvolatile memory cell portion 12 has a transistor $Q_{22}$, a transistor $Q_{31}$, a transistor $Q_{23}$, a capacitor $C_{31}$, a tunnel capacitor $TC_{31}$, and a capacitor module $CM_{31}$. The capacitor module $CM_{31}$ has three electrodes $D_{31}$, $D_{32}$, and $D_{33}$. Capacitances exist in the module $CM_{31}$ between the electrodes $D_{31}$ and $D_{32}$ and between the electrodes $D_{31}$ and $D_{33}$. The drain of the transistor $Q_{22}$ is connected to a power source $V_{CC}$ (normally at +5 V)), the source thereof is connected to the drain of the transistor $Q_{23}$, and the connecting point is designated as a node $N_{23}$. The voltage applied to the drain of the transistor $Q_{22}$ need not be of a fixed voltage such as the power source voltage $V_{CC}$ but need only be such that it is increased to the $V_{CC}$ level only during recall.

The source of the transistor $Q_{23}$ is connected to the node $N_{21}$ of the volatile memory cell. One terminal of the capacitor $C_{31}$ receives a high-voltage control power source $V_{HH}$ for writing. The other terminal of the capacitor $C_{31}$ is connected to one electrode of the tunnel capacitor $TC_{31}$ and a connecting point thereof is designated as a node $N_{31}$. The capacitances of the capacitors included in the capacitor module $CM_{31}$ and the capacitor $C_{31}$ are selected to be sufficiently greater than that of the tunnel capacitor $TC_{31}$. The electrode $D_{31}$ of the capacitor module $CM_{31}$ is connected to the drain of the transistor $Q_C$ and to the gate of the transistor $Q_{31}$. The connecting point is designated as a node $N_{22}$. The electrode $D_{32}$ of the capacitor module $CM_{31}$ is connected to the high-voltage control power source $V_{HH}$ and the electrode $D_{33}$ thereof is connected to the other electrode of the tunnel capacitor $TC_{31}$ and to the gate of the transistor $Q_{22}$. The connecting point is designated as a node $N_{32}$. The drain of the transistor $Q_{31}$ is connected to the node $N_{31}$ and the source thereof is connected to a power source $V_{SS}$ (normally at 0 V). The gate of the transistor $Q_{23}$ receives a recall (RC) signal.

The operation of the memory cell according to the ninth embodiment of the present invention will now be described. The volatile dynamic memory cell 11 stores one-bit data by storing charges in the node $N_{21}$. First, a case will be described wherein the content of the memorized data in the volatile dynamic memory cell 11 is transferred to the nonvolatile memory cell portion 12. When the word line WL is at low level, the transistor $Q_{21}$ is cut off. When the node $N_{21}$ is charged and at high level, the transistor $Q_C$ is turned on (conductive) and the node $N_{22}$ is at low level. The transistor $Q_{31}$ is cut off and the node $N_{31}$ is in a floating state. When the high voltage $V_{HH}$ is boosted from 0 V to 25 V, the floating gate (node $N_{32}$) is at low level (about several volts) due to the capacitive coupling between the electrodes $D_{31}$ and $D_{33}$ of the capacitor module $CM_{31}$. The node $N_{31}$ is set at about 22 V by the capacitor $C_{31}$. In this manner, a potential difference of about 20 V is caused between the two electrodes of the tunnel capacitor $TC_{31}$. Since the thickness of an insulating film between the two electrodes of the tunnel capacitor is about 150 Å, an electric field stronger than 10 MV/cm is applied to the insulating film, thereby causing the tunnel effect. By this tunnel effect, electrons are injected from the node $N_{32}$ to the node $N_{31}$ and the high voltage $V_{HH}$ is removed, so that the node $N_{32}$ is positively charged.

When the node $N_{21}$ is at low level, the transistor $Q_C$ is cut off and the node $N_{22}$ is in a floating state. When the high voltage $V_{HH}$ is boosted from 0 V to 25 V under this state, the node $N_{22}$ is set at about 22 V due to the electrostatic capacitive coupling between the electrodes $D_{31}$ and $D_{32}$ of the capacitor module $CM_{31}$. As a result, the transistor $Q_{31}$ is turned on and the node $N_{31}$ is at low level (0 V). Furthermore, due to the electrostatic capacitive coupling between the electrodes $D_{31}$ and $D_{33}$ of the capacitor module $CM_{31}$, the floating gate (node $N_{32}$) is set at about 20 V. As a result, a potential difference of about 20 V is applied across the two electrodes of the tunnel capacitor $TC_{31}$ and the electrons are injected from the node $N_{31}$ to the node $N_{32}$ by the tunnel effect. When the high voltage $V_{HH}$ is removed, the node $N_{32}$ is negatively charged. In this manner, even if the power supply is cut off, the stored positive or negative charges are held for a long period of time, so that they can be utilized for the nonvolatile memory.

The data stored in the nonvolatile memory cell portion 12 is transferred to the volatile memory cell in the following manner. When the recall signal is set at high level and is supplied to the gate of the transistor $Q_{23}$, the transistor $Q_{23}$ is turned on. When the node $N_{32}$ is positively charged, the transistor $Q_{22}$ also is turned on, and a current is supplied from the power source $V_{CC}$ to the node $N_{21}$, thereby charging the capacitor constituted by the transistor $Q_C$. When the node $N_{32}$ is negatively charged, since the transistor $Q_{22}$ is cut off, the node $N_{21}$ is not conductive, so that the transistor $Q_C$ is not charged. During recall, the volatile memory cell 11 is initially set at low level, and the word line WL is also set at low level.

Figure 12:
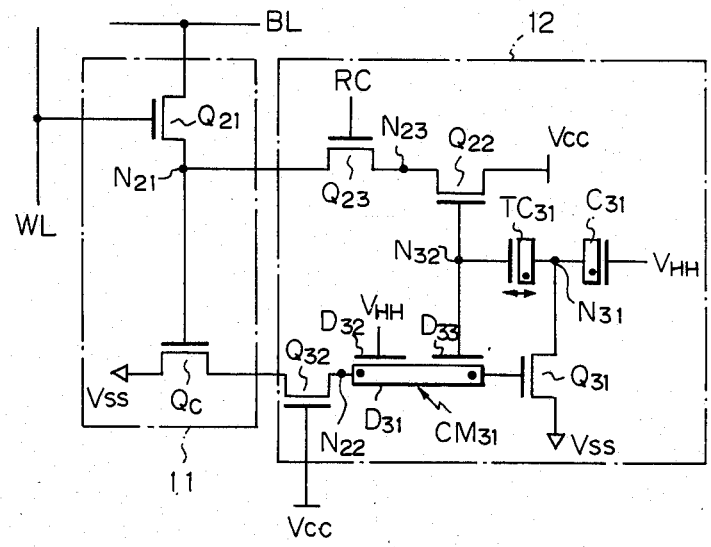
FIG. 12 shows a circuit diagram of a memory cell as a modification of the memory cell in FIG. 11.

FIG. 12 shows a circuit diagram of a memory cell as a modification of the present embodiment. In the circuit, a transistor $Q_{32}$ is arranged between the node $N_{22}$ and the transistor $Q_C$ of the circuit shown in FIG. 11, and the power source voltage $V_{CC}$ is applied to the gate thereof. The voltage to be applied to the gate is not a fixed voltage but need only be a signal which goes to a level $V_{CC}$ only when transferring data from the volatile dynamic memory cell to the nonvolatile memory cell. With this configuration, the voltage applied to the drain of the transistor $Q_C$ is limited by the transistor $Q_{32}$ and the effect of the capacitive coupling between the drain and the gate of the transistor $Q_C$, which would cause an undesirable voltage rise at the gate with a voltage rise at the drain, can be reduced, thereby reducing adverse effects (probability of an erroneous operation) on the dynamic memory cell. The drain voltage of the transistor $Q_C$ is suppressed at $V_{CC} - V_{th}$ by the transistor $Q_{32}$.

Figure 13:
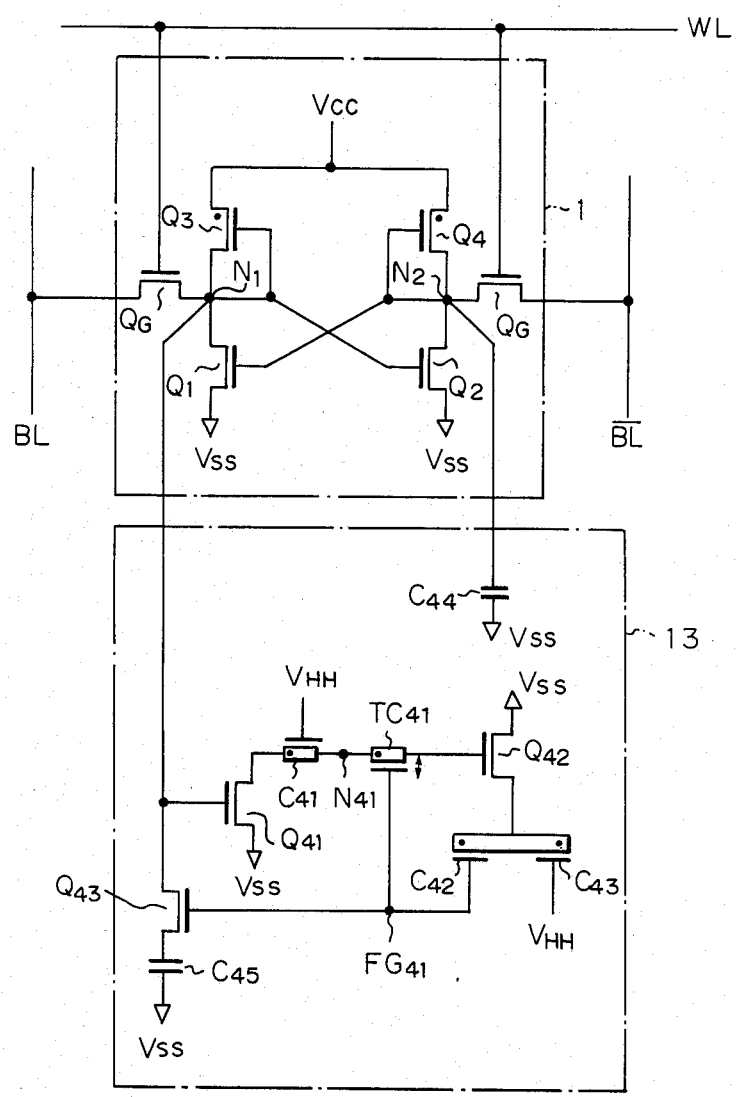
FIG. 13 shows a circuit diagram of a memory cell used in a semiconductor memory device according to a tenth embodiment of the present invention.

FIG. 13 is a circuit diagram of a memory cell of a semiconductor memory device according to a tenth embodiment of the present invention. The memory cell of this type has a volatile static memory cell portion 1 and a nonvolatile memory cell portion 13.

The volatile static memory cell portion 1 is the same as the conventional static memory cell including a flip-flop circuit, and a detailed description thereof is omitted. The flip-flop circuit stores one-bit data in accordance with whether the two connecting points cross-coupled to each other, i.e., a node $N_1$ connected to the drain of a transistor $Q_1$ and a node $N_2$ connected to the drain of a second transistor $Q_2$, are at high or low level. One of the nodes $N_1$ and $N_2$ is at low level when the other is at high level.

The nonvolatile memory cell portion 13 has a transistor $Q_{41}$, a transistor $Q_{42}$, a capacitor $C_{42}$, a capacitor $C_{43}$, a capacitor $TC_{41}$ as a floating gate circuit element, a capacitor $C_{41}$, a transistor $Q_{43}$, a capacitor $C_{44}$, and a capacitor $C_{45}$. The capacitor $C_{41}$ and the transistor $Q_{41}$ are included in the first write circuit, and the capacitor $C_{43}$ and the transistor $Q_{42}$ are included in the second write circuit. The capacitors $C_{42}$ and $C_{43}$ have a common electrode. The capacitances of the capacitors $C_{41}$, $C_{42}$, and $C_{43}$ are selected to be sufficiently larger than that of the tunnel capacitor $TC_{41}$. The capacitance of the capacitor $C_{45}$ is selected to be larger than that of the capacitor $C_{44}$.

The node $N_1$ of the flip-flip of the volatile static memory cell portion 1 is connected to the gate of the transistor $Q_{41}$ and the drain of the transistor $Q_{43}$. The source of the transistor $Q_{43}$ is connected to a power source $V_{SS}$ (normally grounded at 0 V) through the capacitor $C_{45}$. The node $N_2$ of the volatile static memory cell portion 1 is connected to the power source $V_{SS}$ through the capacitor $C_{44}$. One electrode of the capacitor $C_{41}$ is connected to the power source $V_{SS}$ through the transistor $Q_{41}$ and is connected to one electrode of the tunnel capacitor $TC_{41}$ and the gate of the transistor $Q_{42}$. A voltage from a high voltage control power source $V_{HH}$ is applied to the other electrode of the capacitor $C_{41}$ and the other electrode of the capacitor $C_{43}$. One electrode of each of the capacitors $C_{42}$ and $C_{43}$ is a common electrode and is connected to the power source $V_{SS}$ through the transistor $Q_{42}$. The other electrode of the tunnel capacitor $TC_{41}$ is connected to the other electrode of the capacitor $C_{42}$ and the gate of the transistor $Q_{43}$.

The operation of the memory cell described above will be described. The data in the volatile memory cell portion 1 is transferred to the nonvolatile memory cell portion 13 in the following menner. When the node $N_1$ of the flip-flop of the volatile static memory cell 1 is at high level, the transistor $Q_{41}$ is turned on. Therefore, one electrode of the capacitor $C_{41}$, one electrode of the tunnel capacitor $TC_{41}$, and the gate of the transistor $Q_{42}$ are at a low level substantially equal to the voltage of the power source $V_{SS}$, since they are connected to the drain of the transistor $Q_{41}$ (the connecting point thereof is designated as a node $N_{41}$). The transistor $Q_{42}$ is then turned off. At this time, when the power source voltage $V_{HH}$ is boosted from 0 V up to about 20 V, a voltage of about 20 V is applied to a series circuit of the capacitors $C_{43}$, $C_{42}$ and the tunnel capacitor $TC_{41}$. Due to the relationship of the capacitances of the series-connected capacitors, most of this voltage of about 20 V is applied between the two electrodes of the tunnel capacitor $TC_{41}$. When the voltage of about 20 V is applied between the two electrodes of the tunnel capacitor $TC_{41}$, an electric field stronger than 10 MV/cm is applied to an insulating film of about 150 Å of the tunnel capacitor, so that the tunnel effect is caused, and the electrons are injected from the node $N_{41}$ to the gate circuit (to be referred to as a node $FG_{41}$) of the transistor $Q_{43}$. In other words, the gate circuit of the transistor $Q_{43}$ is negatively charged. This state is held for a long period of time after the power source is cut off.

When the node $N_1$ is at low level, the transistor $Q_{41}$ is turned off and the node $N_{41}$ is in a floating state. When the power source $V_{HH}$ is boosted from 0 up to about 20 V, the voltage of the node $N_{41}$ becomes about 20 V due to the capacitive coupling of the capacitor $C_{41}$. Therefore, the transistor $Q_{42}$ is turned on, and the drain of the transistor $Q_{42}$ and one electrode of each of the capacitors $C_{42}$ and $C_{43}$ connected thereto are at about 0 V. As a result, the voltage of about 20 V is applied to the series circuit of the capacitor $C_{41}$, the tunnel capacitor $TC_{41}$, and the capacitor $C_{42}$. From the relationship of the capacitances of these capacitors, most of the voltage of about 20 V is applied between the two electrodes of the tunnel capacitor $TC_{41}$. The electrons are injected from the node $FG_{41}$ to the node $N_{11}$ by the tunnel effect so that the node $FG_{41}$ is positively charged. This state is held for a long period of time after the power source is cut off. When the node $FG_{41}$ is positively charged, the transistor $Q_{43}$ is turned on. When the node $FG_{41}$ is negatively charged, the transistor $Q_{43}$ is turned off.

The operation for transferring the data stored in the nonvolatile memory cell portion 13 (corresponding to the charging state of the node $FG_{41}$) to the volatile memory cell portion 1 will be described. When the power source voltage $V_{CC}$ is boosted from 0 V to 5 V, if the node $FG_{41}$ is positively charged, the node $N_1$ of the flip-flop is set at low level since the transistor $Q_{43}$ is turned on and the capacitor $C_{45}$ is connected to the node $N_1$. In other words, since the capacitance of the capacitor $C_{45}$ is larger than that of the capacitor $C_{44}$, the node $N_1$ is set at low level because the load capacitance of the node $N_1$ is great. If the node $FG_{41}$ is negatively charged, since the transistor $Q_{43}$ is turned off and the capacitor $C_{45}$ is disconnected from the node $N_1$, the node $N_1$ of the flip-flop is set at high level. That is, the load capacitance of the node $N_2$ to which the capacitor $C_{44}$ is connected is large, so that the node $N_2$ is set at low level, thereby setting the node $N_1$ at high level.

Figure 14:
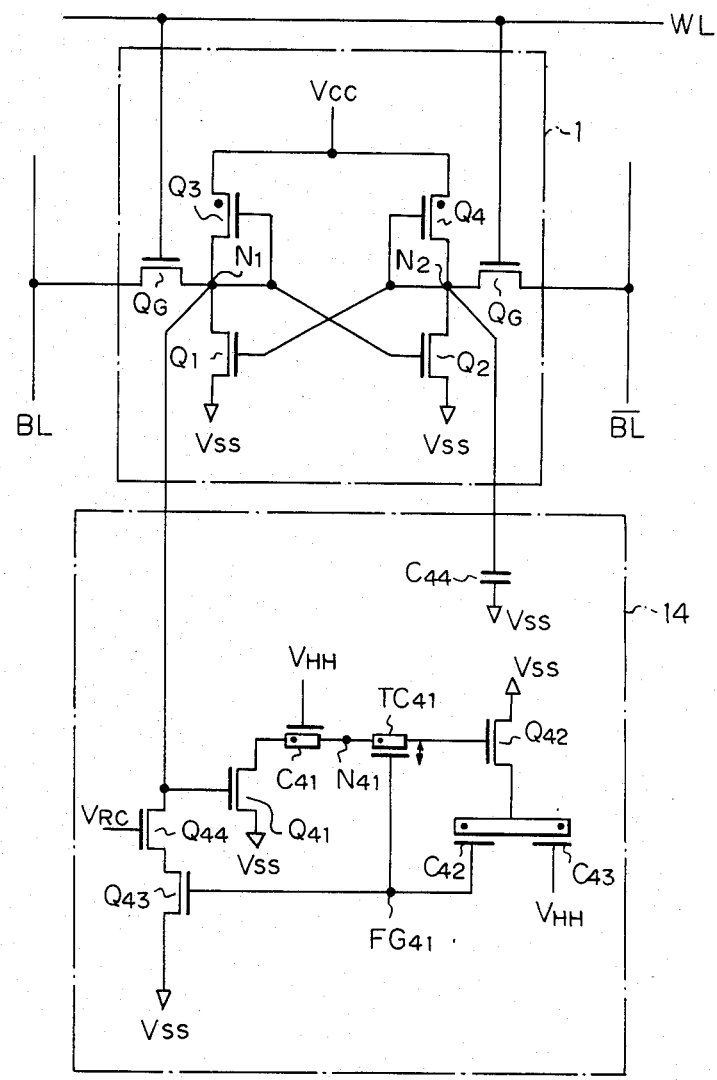
FIG. 14 shows a circuit diagram of a memory cell used in a semiconductor memory device according to an eleventh embodiment of the present invention.

FIG. 14 is a circuit diagram of a memory cell of a semiconductor memory device according to an eleventh embodiment of the present invention. The memory cell of this embodiment has a volatile static memory cell portion 1 and a nonvolatile memory cell portion 14. The volatile static memory cell portion 1 is the same as that in the first embodiment. The nonvolatile memory cell portion 14 is different from that in the tenth embodiment in that a transistor $Q_{44}$ is provided at a side of a node $N_1$ of a transistor $Q_{43}$ in place of the capacitor $C_{45}$. An array recall signal $V_{RC}$ is supplied to the gate of the transistor $Q_{44}$. The array recall signal $V_{RC}$ goes high for a short period of time in synchronism with a timing of the boost of a power source voltage $V_{CC}$ from 0 to 5 V when the data is transferred from the nonvolatile memory cell portion 14 to the volatile memory cell portion 1.

The operation of the eleventh embodiment will be described. The operation for transferring the data from the volatile static memory cell portion 1 to the nonvolatile memory cell portion 14 is the same as that described in the tenth embodiment and a detailed description thereof is omitted. The same reference numerals and symbols as in FIG. 13 are used to denote the same or equivalent elements of the memory cell.

The data is transferred from the nonvolatile memory cell portion 14 to the volatile static memory cell portion 1 in the following manner. When a node $FG_{41}$ is positively charged, the transistor $Q_{43}$ is ON. When the power source voltage $V_{CC}$ is boosted from 0 to 5 V and the signal $V_{RC}$ is at high level for a short period of time, the transistor $Q_{44}$ is turned on and the node $N_1$ is set at a level of a power source voltage $V_{SS}$ for a short period of time, so that the node $N_1$ of the flip-flop is set at low level. When the node $FG_{41}$ is negatively charged, the transistor $Q_{43}$ is turned off. The node $N_1$ is floating from the power source $V_{SS}$ irrespective of the state of the transistor $Q_{44}$. Meanwhile, since a capacitor $C_{44}$ is connected to a node $N_2$, when the power source voltage $V_{CC}$ is boosted from 0 to 5 V, the node $N_2$ is set at low level and the node $N_1$ is set at high level. According to the eleventh embodiment, the data in the nonvolatile memory cell portion can be transferred to the volatile memory cell portion without using the capacitor $C_{45}$, thereby decreasing the occupying area of the substrate per memory cell. In addition, since the drain voltage of the transistor $Q_{43}$ goes low when the transistor $Q_{44}$ is cut off, hot electrons will not be injected from the drain to the gate thereof, and variations in the charge amount of the floating gate circuit are prevented, thereby stably holding the data for a long period of time.

According to the present embodiment, a memory cell can be formed by using only data in one of the cross-coupled nodes of a volatile static memory cell, so that the layout can be discretionarily determined when the memory cells are integrated, thereby decreasing the area of the substrate occupied by each memory cell.

Figure 15:
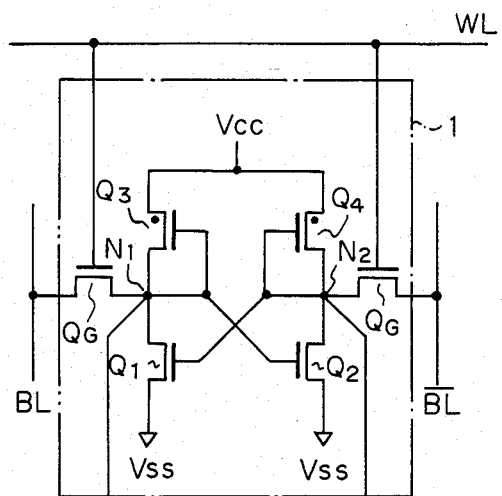
FIG. 15 shows a circuit diagram of a memory cell used in a semiconductor memory device according to a twelfth embodiment of the present invention.

FIG. 15 shows a memory cell of a semiconductor memory device according to a twelfth embodiment of the present invention. This memory cell has a volatile static memory cell portion 1 and a nonvolatile memory cell portion 15.

The voltage static memory cell portion 1 is the same as the conventional static memory cell using the transistors $Q_1$ and $Q_2$, and the like, and a detailed description thereof is omitted. The nonvolatile memory cell portion 15 is almost the same as the nonvolatile memory cell portion 3 shown in FIG. 2, except that the gate of a transistor $Q_{57}$ is not connected to a node $N_2$ of the volatile static memory cell portion 1 but to a transistor $Q_{59}$.

The nonvolatile memory cell portion 15 has MIS transistors $Q_{59}$, $Q_{57}$, and $Q_{58}$, a capacitor module $CM_{52}$, capacitors $C_{53}$, $C_{54}$, and $C_{55}$, and a tunnel capacitor $TC_{53}$.

The capacitor module $CM_{52}$ has capacitances between an electrode $D_{54}$ and each of other electrodes $D_{55}$ and $D_{56}$, respectively. The capacitance of the tunnel capacitor $TC_{53}$ is selected to be sufficiently smaller than the capacitance between the electrodes of the capacitor module and the capacitance of the capacitor $C_{55}$.

A node $N_1$ of the volatile static memory cell portion 1 is connected to the capacitor $C_{53}$ and to the gate of the transistor $Q_{59}$. The other terminal of the capacitor $C_{53}$ is connected to a power source $V_{SS}$ (0 V = ground voltage). The drain of the transistor $Q_{59}$ is connected to the electrode $D_{54}$ of the capacitor module $CM_{52}$ and the source thereof is connected to the power source $V_{SS}$. A write high-voltage control power source $V_{HH}$ is applied to the electrode $D_{55}$ of the capacitor module $CM_{52}$ and to the capacitor $C_{55}$ as needed.

The node $N_2$ of the volatile static memory cell portion 1 is connected to the drain of the transistor $Q_{58}$ as the floating transistor, the source of the transistor $Q_{58}$ is connected to one terminal of the capacitor $C_{54}$, and the gate of the transistor $Q_{58}$ is connected to the electrode $D_{56}$ of the capacitor module $CM_{52}$. The other terminal of the capacitor $C_{54}$ is connected to the power source $V_{SS}$. The gate of the transistor $Q_{57}$ is connected to the electrode $D_{54}$ of the capacitor module $CM_{52}$, the source thereof is connected to the power source $V_{SS}$, and the drain thereof is connected to a node $N_{54}$ which is a connecting point of the capacitor $C_{55}$ and the tunnel capacitor $TC_{53}$. One electrode of the tunnel capacitor $TC_{53}$ is connected to the gate of the transistor $Q_{58}$, that is, to a node FG. The node connected to the electrode $D_{54}$ of the capacitor module $CM_{52}$ will be referred to as node $N_{53}$.

In the memory cell shown in FIG. 15, an operation for transferring the data in the volatile static memory cell portion 1 to the nonvolatile memory cell portion 15 will be described. Assume that the node $N_1$ is at low level, and the node $N_2$ is at high level. In this atate, the power source voltage $V_{HH}$ is boosted from 0 V to between 20 V and 30 V. At this time, since the node $N_1$ is at low level, the transistor $Q_{59}$ is cut off. Although the node $N_{53}$ is floating, when the power source voltage $V_{HH}$ is boosted from 0 V to between 20 and 30 V, the node $N_{53}$ is set at high level by the capacitive coupling. Therefore, the transistor $Q_{57}$ is turned on, the node $N_{54}$ is set at low level, and the power source voltage $V_{HH}$ is applied to a series circuit of the capacitance between the electrodes $D_{54}$ and $D_{55}$ of the capacitor module $CM_{52}$, the capacitance between the electrodes $D_{54}$ and $D_{56}$ thereof, and the capacitance of the tunnel capacitor $TC_{59}$. Since the capacitance of the capacitor module $CM_{52}$ is sufficiently larger than that of the tunnel capacitor $TC_{53}$, as described above, most of the power source voltage $V_{HH}$ is applied to the tunnel capacitor $TC_{53}$. When the voltage of about 20 V is applied to the tunnel capacitor, an electric field of more than 10 MV/cm is applied to the insulating film having a thickness of about 150 Å, thereby causing the tunnel effect. Electrons are injected to the node FG by the tunnel effect, so that the floating gate circuit of the transistor $Q_{58}$ is negatively charged, the transistor $Q_{58}$ is turned off, and the saving of the data from the volatile static memory cell portion 1 to the nonvolatile memory cell portion 15 is completed.

When the node $N_1$ of the volatile static memory cell portion 1 is at high level and the node $N_2$ thereof is at low level, the transistor $Q_{59}$ is turned on and the node $N_{53}$ is set at low level, thereby cutting off the transistor $Q_{57}$. Therefore, the power source voltage $V_{HH}$ (about 20 V) is applied to the series circuit of the capacitances of the capacitor $C_{55}$ and the tunnel capacitor $TC_{53}$, and between the electrodes $D_{54}$ and $D_{56}$ of the capacitor module $CM_{52}$, so that most of the volta $V_{HH}$ is applied to the tunnel capacitor $TC_{53}$ due to the relationship of the capacitances of the capacitors. In this case, since the node $N_{54}$ is higher in potential level than the node FG, the electrons are extracted from the floating gate of the transistor $Q_{58}$ to the node $N_{54}$ by the tunnel effect. As a result, the node FG is positively charged and the transistor $Q_{58}$ is turned on, and saving of the data from the volatile static memory cell portion 1 to the nonvolatile memory cell portion 15 is completed.

An operation for transferring the data from the nonvolatile memory cell portion 15 to the volatile static memory cell portion 1 will be described. First, of the power source voltages $V_{CC}$ and $V_{HH}$ at 0 V, only the voltage $V_{CC}$ is boosted to 5 V. If the node FG is negatively charged, the transistor $Q_{58}$ is cut off and the node $N_2$ and the capacitor $C_{54}$ are then cut off from each other. Since the node $N_1$ is connected to the capacitor $C_{53}$, the flip-flop circuit is set so that the node $N_1$ having a larger load capacitance is set at low level and the node $N_2$ is set at high level when the power source voltage $V_{CC}$ is boosted. However, if the electrons are extracted from the floating gate of the transistor $Q_{58}$ and a positive charge is stored in the floating gate, the transistor $Q_{58}$ is turned on, and the node $N_2$ and the capacitor $C_{54}$ are connected to each other. Since the capacitance of the capacitor $C_{54}$ is selected to be larger than that of the capacitor $C_{53}$, the flip-flop circuit of the volatile static memory cell portion 1 is set so that the node $N_2$ is set at low level and the node $N_1$ is set at high level when the power source voltage $V_{CC}$ is boosted.

Figure 16:
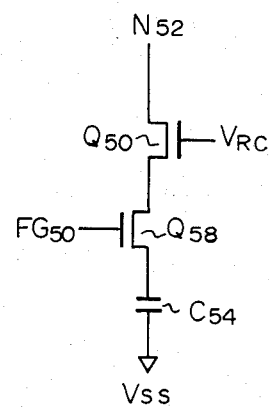
FIG. 16 shows a partial circuit diagram of a memory cell as a modification of the memory cell in FIG. 15.
Figure 17:
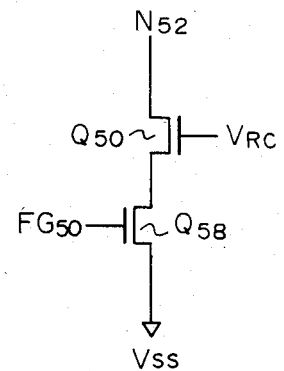
FIG. 17 shows a partial circuit diagram of a memory cell as another modification of the memory cell in FIG. 15.

FIGS. 16 and 17 show modifications of this embodiment. FIGS. 16 and 17 show circuit portions in the vicinity of the transistor $Q_{58}$ of the nonvolatile memory cell portion 15 of FIG. 15. When the circuit shown in FIG. 16 is compared with that shown in FIG. 15, a transistor $Q_{50}$ is inserted between the node $N_2$ and the transistor $Q_{58}$ and is turned on/off in accordance with an array recall signal $V_{RC}$. The array recall signal goes high only for a short period of time when the data in the nonvolatile memory cell portion 15 is transferred to the volatile memory cell portion 1. When the data in the nonvolatile memory cell portion 15 is transferred to the volatile memory cell portion 1 in this manner, if the floating gate of the transistor $Q_{58}$ is positively charged and the transistor $Q_{58}$ is turned on, the transistor $Q_{50}$ is turned on for a short period of time to decrease the voltage applied to the node $N_2$. By this operation, the recall capacitor $C_{54}$ can be omitted as in the modification shown in FIG. 17. As a result, the area occupied in the semiconductor substrate by each memory cell can be decreased. In addition, since the drain voltage of the transistor $Q_{58}$ is at low level when the transistor $Q_{50}$ is cut off, hot electrons will not be injected from the drain to the gate thereof, so that variations in the charge amount of the floating gate circuit may be prevented, thereby stably holding the data for a long period of time.

According to the present embodiment, the design of the layout of the device can be performed at the manufacturer's discretion.

Figure 18A:
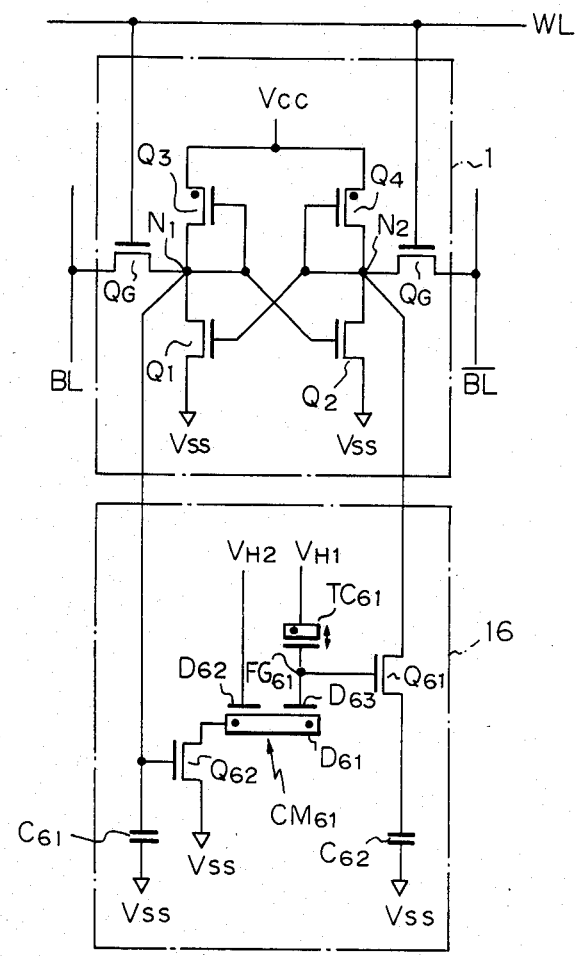
FIG. 18A shows a circuit diagram of a memory cell used in a semiconductor memory device according to a thirteenth embodiment of the present invention.

FIG. 18A shows a circuit diagram of a memory cell of a semiconductor memory device according to a thirteenth embodiment of the present invention. The memory cell has a volatile static memory cell portion 1 and a nonvolatile memory cell portion 16. The volatile static memory cell portion 1 is the same as the conventional static memory cell, and a detailed description thereof will be omitted.

The nonvolatile memory cell portion 16 has a MIS transistor $Q_{62}$, a MIS transistor $Q_{61}$, a capacitor module $CM_{61}$, capacitors $C_{61}$ and $C_{62}$, and a tunnel capacitor $TC_{62}$ which is a floating gate element.

One cross-coupled connecting point, i.e., a first node $N_1$, of a flip-flop of the volatile static memory cell portion 1 is connected to a power source $V_{SS}$ (normally grounded) through the capacitor $C_{61}$. The other cross-coupled connecting point, i.e., a second node $N_2$, of the flip-flop is connected to the power source $V_{SS}$ through the transistor $Q_{61}$ and the capacitor $C_{62}$. A first high-voltage control power source $V_{H1}$ is connected to the gate of the transistor $Q_{61}$ and an electrode $D_{63}$ of the capacitor module $CM_{61}$ through the tunnel capacitor $TC_{61}$. A second high-voltage power source $V_{H2}$ is connected to the electrode $D_{62}$ of the capacitor module $CM_{61}$. An electrode $D_{61}$ of the capacitor module $CM_{61}$ is connected to the power source $V_{SS}$ through the transistor $Q_{62}$. The gate of the transistor $Q_{62}$ is connected to the node $N_1$.

The capacitor module $CM_{61}$ has capacitances between the electrodes $D_{61}$ and $D_{62}$ and between the electrodes $D_{61}$ and $D_{63}$. Each of the capacitances is selected to be sufficiently larger than that of the tunnel capacitor $TC_{61}$. The capacitance of the capacitor $C_{62}$ is set to be larger than that of the capacitor $C_{61}$.

The operation of the above-mentioned memory cell will be described. First, data in the volatile static memory cell portion 1 is transferred to the nonvolatile memory cell portion 16 in the following manner. The high-voltage control power source voltage $V_{H2}$ is set at 0 V (ground potential) and the high-voltage control power source voltage $V_{H1}$ is boosted from 0 V to about 20 V. The voltage of about 20 V is applied in series with the tunnel capacitor $TC_{61}$, the capacitance between the electrodes $D_{63}$ and $D_{61}$, and the capacitance between the electrodes $D_{61}$ and $D_{62}$ when the node $N_1$ is at low level. Most of this voltage is applied to the two ends of the tunnel capacitor $TC_{61}$ due to the relationship of the magnitudes of the capacitances. When the voltage of about 20 V is applied to the two ends of the tunnel capacitor $TC_{61}$, and electric field stronger than 10 MV/cm is applied to the insulating film having a thickness of about 150 Å, so that a tunnel effect is caused. Electrons are extracted from the floating gate circuit, i.e., a node $FG_{61}$, of the transistor $Q_{61}$ by the tunnel effect, and the node $FG_{61}$ is positively charged.

Then, when the power source voltage $V_{H1}$ is decreased to 0 V and the power source voltage $V_{H2}$ is boosted to about 20 V, the transistor $Q_{62}$ is turned on if the node $N_1$ is set at high level (5 V) by the data of the volatile memory portion, and the electrode $D_{61}$ is substantially at a level (low level) of the power source voltage $V_{SS}$. However, the node $FG_{61}$ is kept unchanged in level. However, if the node $N_1$ is set at low level by the data of the volatile memory portion, the transistor $Q_{62}$ is turned off, the electrode $D_{61}$ is in a floating state, and the levels of the electrode $D_{61}$ and the node $FG_{61}$ are boosted to about 20 V due to the relationship of capacitances of the capacitors. Since a voltage opposite in polarity to that in the case described above is applied to the two ends of the tunnel capacitor $TC_{61}$, electrons are injected into the node $FG_{61}$ by the tunnel effect, so that the node $FG_{61}$ is negatively charged. That is, when the node $N_1$ is at high level, the node $FG_{61}$ is positively charged by the data transfer. When the node $N_1$ is at low level, the node $FG_{61}$ is negatively charged. The stored charges are held for a long period of time after the power source is cut off.

The operation for transferring the data in the nonvolatile memory cell portion 16 to the volatile memory cell portion 1 will be described. When a power source voltage $V_{CC}$ of the flip-flop is boosted from 0 V to 5 V, the flip-flop is set according to the state of the node $FG_{61}$ as follows. If the node $FG_{61}$ is positively charged, the transistor $Q_{61}$ is turned on. If the capacitor $C_{62}$ is connected to the node $N_2$ and the node $FG_{61}$ is negatively charged, the transistor $Q_{61}$ is turned off and the capacitor $C_{62}$ is disconnected from the node $N_2$. The capacitance of the capacitor $C_{62}$ is larger than that of the capacitor $C_{61}$. When the capacitor $C_{62}$ is connected to the node $N_2$, the load capacitance of the node $N_2$ is large and the flip-flop is set so that the node $N_1$ is set at high level. When the capacitor $C_{62}$ is not connected to the node $N_2$, the load capacitance of the node $N_1$ is large and the flip-flop is set so that the node $N_2$ is set at high level. That is, when the node $FG_{61}$ is positively charged, the node $N_1$ is set at high level, and when the node $FG_{61}$ is negatively charged, the node $N_1$ is set at low level.

Figure 18B:
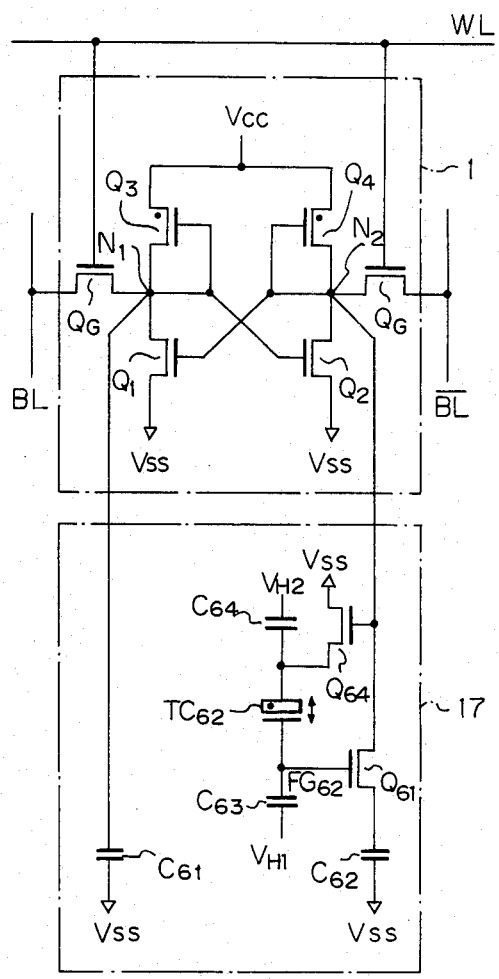
FIG. 18B shows a circuit diagram of a memory cell as a modification of the memory cell in FIG. 18A.

FIG. 18B shows a modification of the thirteenth embodiment of the present invention. The memory cell has a volatile static memory cell portion 1 and a nonvolatile memory cell portion 17. the volatile static memory cell portion 1 is the same as the conventional static memory cell.

The nonvolatile memory cell portion 17 has MIS transistors $Q_{61}$ and $Q_{64}$, capacitors $C_{61}$, $C_{62}$, $C_{63}$, and $C_{64}$, and a tunnel capacitor $TC_{62}$ which is a floating gate element. A first high-voltage control power source $V_{H1}$ is connected to the gate of the transistor $Q_{61}$ and one electrode of the tunnel capacitor $TC_{62}$ through the capacitor $C_{63}$. The other electrode of the tunnel capacitor $TC_{62}$ is connected to a second high-voltage control power source $V_{H2}$ through the capacitor $C_{64}$, and is connected to the power source $V_{SS}$ through the transistor $Q_{64}$. The gate of the transistor $Q_{64}$ is connected to node $N_2$. The node connected to the gate of the transistor $Q_{61}$ is referred as a node $FG_{62}$.

The operation of the above-mentioned memorly cell will be described. Data in the volatile static memory cell portion 1 is transferred to the nonvolatile memory cell portion 17 in the following manner. The high-voltage control power source voltage $V_{H2}$ is set at 0 V and the high-voltage control power source voltage $V_{H1}$ is boosted from 0 V to about 20 V. In spite of the high or low level of the potential of the node $N_2$, electrons are injected into the node $FG_{62}$ by the tunnel effect and the node $FG_{62}$ is negatively charged.

When the power source voltage $V_{H1}$ is set at 0 V and the power source voltage $V_{H2}$ is boosted from 0 V to about 20 V, if the node $N_2$ is at a high level, the voltage of about 20 V is applied only across the capacitor $C_{64}$. Therefore, the node $FG_{62}$ is held in a negatively charged state. If the node $N_2$ is at a low level, the voltage of about 20 V is applied to the tunnel capacitor $TC_{62}$. Therefore, electrons are extracted from the node $FG_{62}$ by the tunnel effect and the node $FG_{62}$ is positively charged.

The operation for transferring the data in the nonvolatile memory cell portion 17 to the volatile memory cell portion 1 is the same as that of the memory cell in FIG. 18A. The operations other than that in the above description are substantially the same as the operations of the memory cell in FIG. 18A.

Figure 19:
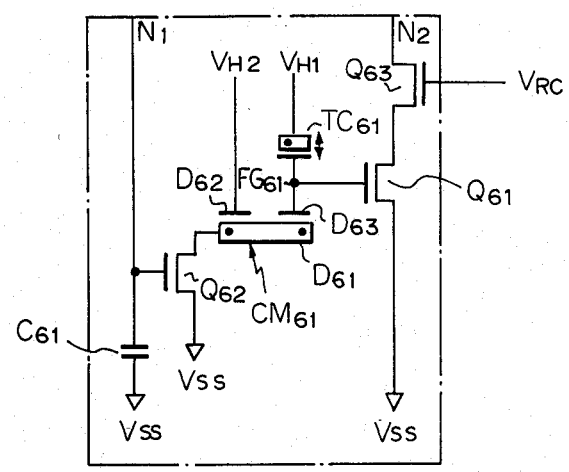
FIG. 19 shows a partial circuit diagram of a memory cell as another modification of the memory cell in FIG. 18A.

FIG. 19 shows another modification of the thirteenth embodiment of the present invention. Only a portion of the circuit corresponding to the nonvolatile memory cell portion in FIG. 18A is shown in FIG. 19. This circuit is obtained by inserting a transistor $Q_{63}$ between the transistor $Q_{61}$ and the node $N_2$ in place of the capacitor $C_{62}$, and an array recall signal $V_{RC}$ is applied to the gate of the transistor $Q_{63}$. The transistor $Q_{63}$ is turned on for a short period of time only when the data in the nonvolatile memory cell portion is transferred to the volatile memory cell portion. That is, the array recall signal is applied to the gate of the transistor $Q_{63}$ for a short period of time when the power source $V_{CC}$ is turned on. When the data in the nonvolatile memory cell portion is transferred to the volatile memory cell portion in this manner, if positive charges are stored in the floating gate circuit of the transistor $Q_{61}$ and the transistor $Q_{61}$ is ON, the transistor $Q_{63}$ is turned on for a short period of time, thereby decreasing the voltage of the node $N_2$. By this operation, the data in the nonvolatile memory cell portion can be transferred to the volatile memory cell portion without using the recall capacitor $C_{62}$, so that the area occupied in the semiconductor substrate by each memory cell can be decreased. In addition, when the recall transistor $Q_{63}$ is cut off, the drain voltage of the transistor $T_{61}$ is at low level ($V_{SS}$), and hot electrons may not be injected from the drain to the gate thereof. As a result, variations in the charge amount of the floating gate circuit are prevented, so that the data can be stably held for a long period of time.

Figure 20:
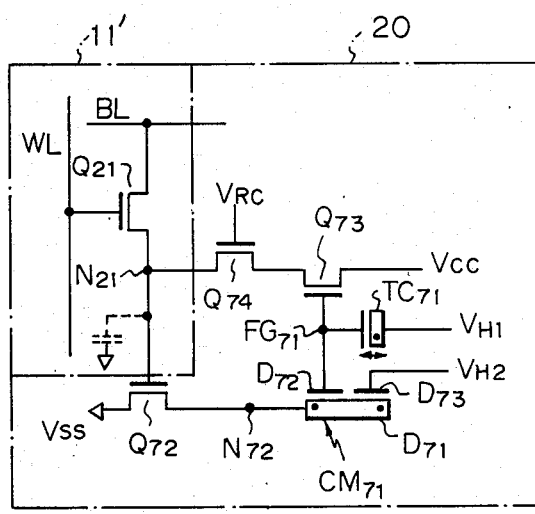
FIG. 20 shows a circuit diagram of a memory cell used in a semiconductor memory device according to a fourteenth embodiment of the present invention.

FIG. 20 shows a circuit diagram of a memory cell of a semiconductor memory device according to a fourteenth embodiment of the present invention. The memory cell of this type has a volatile dynamic memory cell portion 11' and a nonvolatile memory cell portion 20.

The volatile dynamic memory cell portion 11' consists of a capacitance of a gate circuit of a MIS transistor $Q_{72}$ as a capacitor portion, and a MIS transistor $Q_{21}$. The gate of the transistor $Q_{21}$ is connected to a word line WL. A bit line BL is connected to the gate of the transistor $Q_{72}$ through the transistor $Q_{21}$. The transistor $Q_{72}$ serves both as a capacitor portion in a dynamic memory cell and as a switching transistor of the nonvolatile memory cell portion. It must be noted that a separate capacitor can be exclusively provided, as indicated in the figure by a dotted line.

The nonvolatile memory cell portion 20 has a MIS transistor $Q_{72}$, a MIS transistor $Q_{73}$, a MIS transistor $Q_{74}$ as a recall transistor, a capacitor module $CM_{71}$, and a tunnel capacitor $TC_{71}$ which is a floating gate circuit element. The capacitor module $CM_{71}$ has electrodes $D_{71}$, $D_{72}$, and $D_{73}$, and has capacitances between the electrodes $D_{71}$ and $D_{72}$, and between the electrodes $D_{71}$ and $D_{73}$. These capacitances are selected to be sufficiently larger than that of the tunnel capacitor $TC_{71}$.

A power source $V_{CC}$ (normally at 5 V) is connected to a node $N_{21}$ as a connecting point between the transistors $Q_{21}$ and $Q_{72}$ through the transistors $Q_{73}$ and $Q_{74}$. The gate of the transistor $Q_{74}$ receives an array recall signal $V_{RC}$. A first high-voltage control power source $V_{H1}$ is connected to one electrode of the tunnel capacitor $TC_{71}$. A second high-voltage power source $V_{H2}$ is connected to the electrode $D_{73}$ of the capacitor module $CM_{71}$. The electrode $D_{71}$ of the capacitor module $CM_{71}$ is connected to a power source $V_{SS}$ (normally at 0 V) through the transistor $Q_{72}$. A connecting point between the electrode $D_{71}$ and the transistor $Q_{72}$ is designated as a node $N_{72}$. The other electrode of the tunnel capacitor $TC_{71}$ is connected to the gate of the transistor $Q_{73}$ and to the electrode $D_{72}$ of the capacitor module $CM_{71}$, and the connecting point thereof is designated as a node $FG_{71}$. The node $FG_{71}$ is a floating electrode surrounded by an insulator.

The operation of the memory cell shown in FIG. 20 will be described. First, the power source voltage $V_{H2}$ is held at 0 V and the power source voltage $V_{H1}$ is boosted from 0 to about 20 V. The signal $V_{RC}$ is set at low level (about 0 V). The voltage of about 20 V is applied in series with the tunnel capacitor $TC_{71}$, and the capacitances between the electrodes $D_{72}$ and $D_{71}$ and between the electrodes $D_{71}$ and $D_{73}$ when the node $N_{21}$ is at low level. Most of the voltage is applied to the two ends of the tunnel capacitor $TC_{71}$ due to the relationship of the magnitudes of the capacitances. Electrons are extracted from the gate of the transistor $Q_{73}$, that is, from the node $FG_{71}$, to the power source $V_{H1}$, and the node $FG_{71}$ is positively charged. Subsequently, when the power source voltage $V_{H1}$ is set at 0 V and the power source voltage $V_{H2}$ is boosted from 0 to about 20 V, if the node $N_{21}$ is set at high level (about 5 V) by the data written in the volatile memory cell portion, the node $N_{72}$ is at low level and is kept in the same state as that mentioned earlier. The node $FG_{71}$ is kept positively charged. If the node $N_{21}$ is at low level due to the data written in the volatile memory cell portion, the two capacitances of the capacitor module $CM_{71}$ and the tunnel capacitor $TC_{71}$ receive a voltage of about 20 V having an opposite polarity to the case mentioned earlier. As a result, most of the voltage is applied to the two electrodes of the tunnel capacitor $TC_{71}$ due to the relationship of the magnitudes of the capacitances. Electrons are injected to the side of the node $FG_{71}$ of the tunnel capacitor $TC_{71}$ by the tunnel effect so that the node $FG_{71}$ is negatively charged. As a result, in accordance with the data stored in the dynamic memory cell, that is, in accordance with whether the level of the node $N_{21}$ is at high or low level, the node $FG_{71}$ is positively or negatively charged. The charged electrons are held for a long period of time after the power source is cut off.

The data stored in the nonvolatile memory cell portion 20 is transferred to the volatile dynamic memory cell portion 11' in the following manner. If the node $FG_{71}$ is positively charged, the transistor $Q_{73}$ is ON. When the array recall signal $V_{RC}$ is at high level, the transistor $Q_{74}$ is also turned on and a voltage from the power source $V_{CC}$ (5 V) is applied to the node $N_{21}$, so that the capacitor of the dynamic memory cell is charged to high level. When the node $FG_{71}$ is negatively charged, the transistor $Q_{73}$ is OFF. In this case, if the signal $V_{RC}$ goes high, the voltage from the power source $V_{CC}$ is not applied to the node $N_{21}$, and the capacitor of the dynamic memory cell is not charged.

Figure 21:
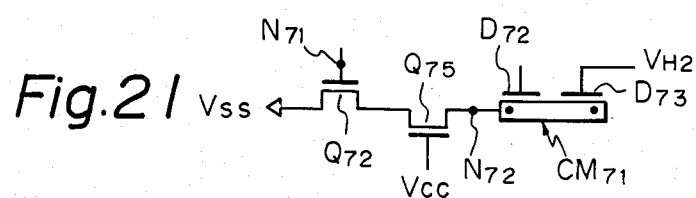
FIG. 21 shows a partial circuit diagram of a memory cell as a modification of the memory cell in FIG. 20.
Figure 22:
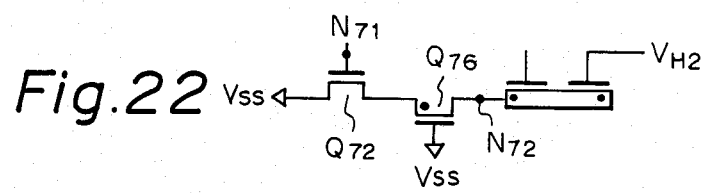
FIG. 22 shows a partial circuit diagram of a memory cell as another modification of the memory cell in FIG. 20.

FIGS. 21 and 22 show modifications of the fourteenth embodiment, respectively. In FIGS. 21 and 22, only portions in the vicinity of the node $N_{72}$ of the circuit shown in FIG. 20 are illustrated. In the circuit shown in FIG. 21, an enhancement-type transistor $Q_{75}$ is inserted between the node $N_{72}$ and the transistor $Q_{72}$, and the voltage from the power source $V_{CC}$ or a control signal is applied to the gate of the transistor $Q_{75}$. In the circuit shown in FIG. 22, a depletion-type transistor $Q_{76}$ replaces the enhancement-type transistor $Q_{75}$, and a voltage from the power source $V_{SS}$ is applied to the gate of the transistor $Q_{76}$. With this configuration, the voltage applied to the drain of the transistor $Q_{72}$ is limited by the transistor $Q_{75}$ or $Q_{76}$ so that the influence of the voltage acting on the side of the gate of the transistor $Q_{72}$ is minimized, thereby reducing adverse effects on the volatile dynamic memory cell.

The memory cell according to the fourteenth embodiment requires a smaller number of constituent elements for the dynamic memory cell portion as compared with that according to the thirteenth embodiment, thereby further simplifying the circuit configuration and reducing the cell occupation area.

Figure 23:
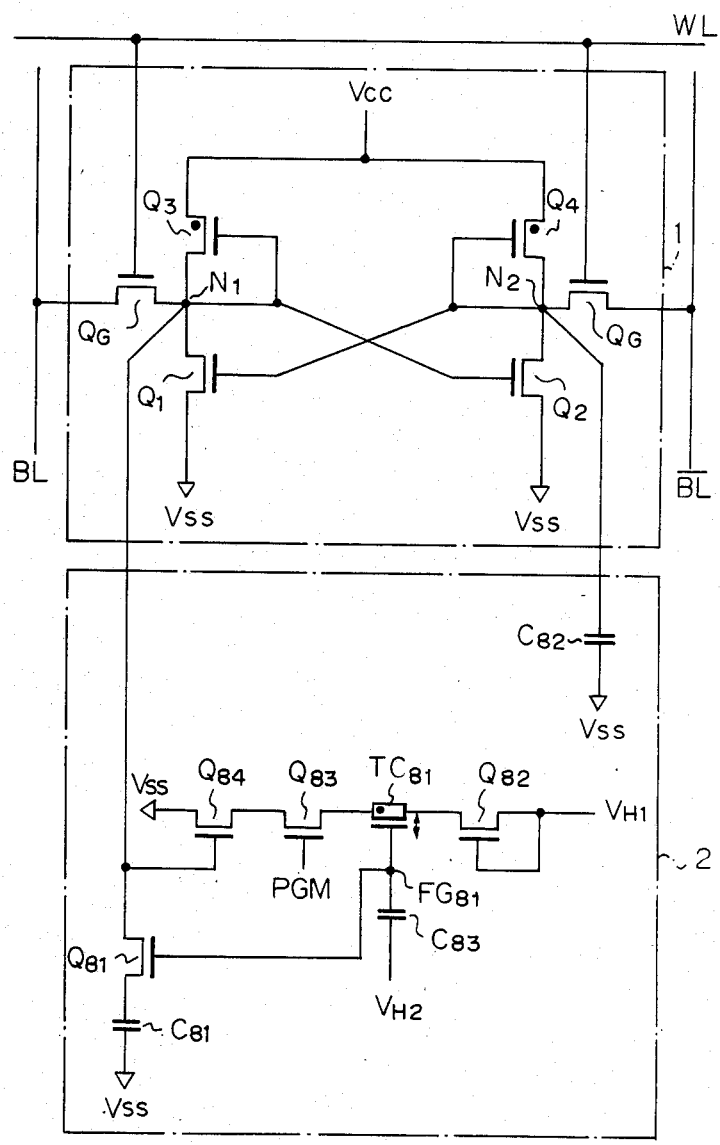
FIG. 23 shows a circuit diagram of a memory cell used in a semiconductor memory device according to a fifteenth embodiment of the present invention.

FIG. 23 is a circuit diagram of a memory cell of a semiconductor memory device according to a fifteenth embodiment of the present invention. The memory cell of this type has a volatile static memory cell portion 1 and a nonvolatile memory cell portion 21. The volatile static memory cell portion 1 is the same as a conventional static memory cell and a detailed description thereof is omitted.

The nonvolatile memory cell portion 21 has a MIS transistor $Q_{84}$, a MIS transistor $Q_{81}$, a MIS PGM transistor $Q_{83}$, a MIS transistor $Q_{82}$ to be used as a diode means, a tunnel capacitor $TC_{81}$, and capacitors $C_{81}$, $C_{82}$, and $C_{83}$. The transistor $Q_{82}$, the PGM transistor $Q_{83}$, and the transistor $Q_{84}$ as a first switch means are included in a first write circuit.

One cross-coupled connecting point, that is, a node $N_1$ of the flip-flop of the volatile static memory cell portion 1, is connected to a power source $V_{SS}$ (normally grounded) through the transistor $Q_{81}$ and the capacitor $C_{81}$. The other cross-coupled connecting point, that is, a node $N_2$ of the flip-flop, is connected to the power source $V_{SS}$ through the capacitor $C_{82}$. One electrode of the tunnel capacitor $TC_{81}$ is connected to the other electrode of the capacitor $C_{83}$ and to the gate of the transistor $Q_{81}$. A voltage is applied from a first high-voltage control power source $V_{H1}$ to the gate and drain of the transistor $Q_{82}$. A second high-voltage control power source $V_{H2}$ is applied to a second write circuit. The source of the transistor $Q_{82}$ is connected to the other electrode of the tunnel capacitor $TC_{81}$. The other electrode of the tunnel capacitor $TC_{81}$ is then connected to the drain of the transistor $Q_{83}$. The source of the transistor $Q_{83}$ is connected to the power source $V_{SS}$ through the transistor $Q_{84}$. The gate of the transistor $Q_{84}$ is connected to the node $N_1$ and the gate of the transistor $Q_{83}$ receives a program signal PGM. A voltage from the second high-voltage control power source $V_{H2}$ is applied to one electrode of the capacitor $C_{83}$. A node connected to the gate of the transistor $Q_{81}$ will be referred to as a node $FG_{81}$. The capacitance of the capacitor $C_{83}$ is selected to be sufficiently larger than that of the tunnel capacitor $TC_{81}$ serving as the floating gate circuit element. The capacitor $C_{81}$ is selected to have a capacitance larger than that of the capacitor $C_{82}$.

The operation of the memory cell mentioned above will be described. First, the operation for transferring data in the volatile static memory cell portion 1 to the nonvolatile memory cell portion 21 is as follows. The signal PGM is set at low level (substantially at 0 V), the power source voltage $V_{H2}$ is set at low level, and the power source voltage $V_{H1}$ is boosted from 0 V to about 20 V. Then, a voltage of about 20 V is applied to a series circuit of the tunnel capacitor $TC_{81}$ and the capacitor $C_{83}$ through the transistor $Q_{82}$. From the relationship of the magnitudes of the capacitances of the tunnel capacitor $TC_{81}$ and the capacitor $C_{83}$, most of the voltage is applied to the tunnel capacitor $TC_{81}$. When a voltage of about 20 V is applied across two electrodes of the tunnel capacitor $TC_{81}$, an electric field stronger than 10 MV/cm is applied to an insulating film of about 150 Å, thereby causing a tunnel effect. By the tunnel effect, electrons are extracted from the floating gate circuit of the transistor $Q_{81}$, i.e., the node $FG_{81}$, so that the node $FG_{81}$ is positively charged.

When the power source voltage $V_{H1}$ is at low level and the signal PGM is at high level (about 5 V), if the gate of the transistor $Q_{84}$, i.e., the node $N_1$, is at high level, the charges of about 20 V charged at the nodes of the source of the transistor $Q_{82}$ and the drain of the transistor $Q_{83}$ pass through the transistor $Q_{84}$, so that the bulk side of the electrode of the tunnel capacitor $TC_{81}$ is at low level (0 V). When the node $N_1$ is at low level, the transistor $Q_{84}$ is turned off, so that the voltage of the electrode at the bulk side of the tunnel capacitor $TC_{81}$ is substantially held at 20 V. At this time, when the power source voltage $V_{H2}$ is boosted from 0 V to about 20 V, if the node $N_1$ is at high level, a voltage of an opposite polarity to that in the case mentioned above is applied to the tunnel capacitor $TC_{81}$, and the node $FG_{81}$ is negatively charged. If the node $N_1$ is at low level, the voltage at the bulk side of the tunnel capacitor $TC_{81}$ is also at about 20 V, and the node $FG_{81}$ is kept positively charged. That is, if the node $N_1$ is at high level, the node $FG_{81}$ is negatively charged, and if the node $N_1$ is at low level, the node $FG_{81}$ is positively charged. The charges charged in this manner are held for a long period of time after the power source is cut off.

The data stored in the nonvolatile memory cell portion 21 is transferred to the volatile static memory cell portion 1 in the following manner. When the power source voltage $V_{CC}$ is boosted from 0 V to 5 V, the flip-flop is set in accordance with the state of the node $FG_{81}$ in the following manner. That is, if the node $FG_{81}$ is positively charged, the transistor $Q_{81}$ is turned on and the capacitor $C_{81}$ is connected to the node $N_1$. If the node $FG_{81}$ is negatively charged, the transistor $Q_{81}$ is turned off to cut off the capacitor $C_{81}$ from the node $N_1$. Since the capacitance of the capacitor $C_{81}$ is larger than that of the capacitor $C_{82}$, the node $N_1$ has a large amount of load capacitance when the capacitor $C_{81}$ is connected to the node $N_1$. Therefore, the flip-flop is set so that the node $N_1$ is at low level. When the capacitor $C_{81}$ is not connected to the node $N_1$, the node $N_2$ has a large amount of load capacitance, so that the flip-flop is set so that the node $N_1$ is at high level. When the node $FG_{81}$ is positively charged, the node $N_1$ is set at low level, and when the node $FG_{81}$ is negatively charged, the node $N_1$ is set at high level.

Figure 24:
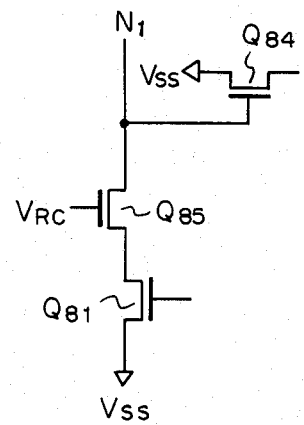
FIG. 24 shows a partial circuit diagram of a memory cell as a modification of the memory cell in FIG. 23.

FIG. 24 shows a modification of the fifteenth embodiment. In the circuit shown in FIG. 24, a transistor $Q_{85}$ is inserted between the transistor $Q_{81}$ and the node $N_1$ in place of the capacitor $C_{81}$, and an array recall signal $V_{RC}$ is applied to the gate of the transistor $Q_{85}$. The transistor $Q_{85}$ is turned on for a short period of time when the data in the nonvolatile memory cell portion is transferred to the volatile memory cell portion. That is, the array recall signal is applied for a short period of time when the power source $V_{CC}$ is turned on. In this manner, when the data in the nonvolatile memory cell portion is transferred to the volatile memory cell portion, if the gate circuit of the transistor $Q_{81}$ is positively charged and the transistor $Q_{81}$ is turned on, the transistor $Q_{85}$ is turned on for a short period of time, thereby decreasing the voltage at the node $N_1$. By this operation, the recall capacitor $C_{81}$ can be omitted. As a result, the area occupied in the semiconductor substrate by each memory cell can be decreased. Furthermore, since the drain voltage of the transistor $Q_{81}$ is at low level when the transistor $Q_{85}$ is cut off, hot electrons will not be injected from the drain to the gate thereof, so that variations in the charge amount of the floating gate circuit are prevented, thereby stably performing data holding for a long period of time.

Figure 25:
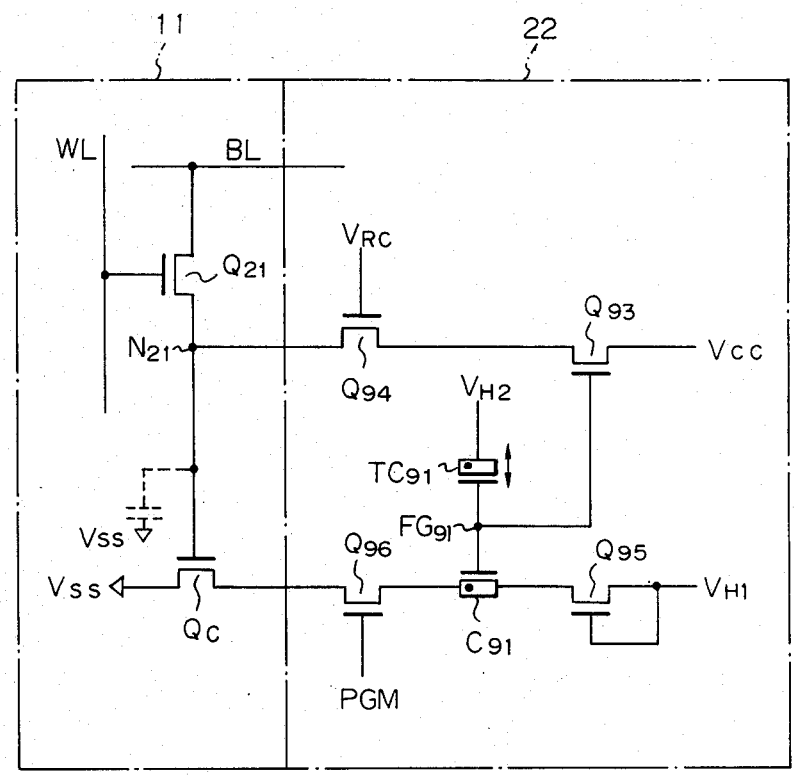
FIG. 25 shows a circuit diagram of a memory cell used in a semiconductor memory device according to a sixteenth embodiment of the present invention.

FIG. 25 is a circuit diagram of a memory cell of a semiconductor memory device according to a sixteenth embodiment of the present invention. The memory cell of this type has a volatile dynamic memory cell portion 11 and a nonvolatile memory cell portion 22. The volatile dynamic memory cell portion 11 has a MIS transfer transistor $Q_{21}$, the gate of which is connected to a word line as a transfer gate, and another MIS transistor $Q_C$ serving as a capacitor portion of the dynamic memory. A bit line BL is connected to the gate of the transistor $Q_C$ through the transistor $Q_{21}$.

The nonvolatile memory cell portion 22 has a MIS transistor $Q_{93}$, an array recall MIS transistor $Q_{94}$, a MIS transistor $Q_{95}$ as a diode means, a MIS transistor $Q_{96}$, a capacitor $C_{91}$, and a tunnel capacitor $TC_{91}$ as a floating gate element. The capacitance of the capacitor $C_{91}$ is selected to be sufficiently larger than that of the tunnel capacitor $TC_{91}$.

A power source $V_{CC}$ (normally at 5 V) is connected to a node $N_{21}$ which is a connecting point between the transistors $Q_{21}$ and $Q_C$ through the transistors $Q_{93}$ and $Q_{94}$. An array recall signal $V_{RC}$ is supplied to the gate of the transistor $Q_{94}$. A voltage from a first high-voltage control power source $V_{H1}$ is applied to the gate and drain of the transistor $Q_{95}$. The source of the transistor $Q_{95}$ is connected to one electrode of the capacitor $C_{91}$. One electrode of the capacitor $C_{91}$ is also connected to a power source $V_{SS}$ (normally at 0 V) through the transistors $Q_{96}$ and $Q_C$. A program signal PGM is supplied to the gate of the PGM transistor $Q_{96}$. One electrode of the tunnel capacitor $TC_{91}$ is connected to the other electrode of the capacitor $C_{91}$ and to the gate of the transistor $Q_{93}$. A voltage from a second high-voltage control power source $V_{H2}$ is applied to the other electrode of the tunnel capacitor $TC_{91}$.

The operation of the memory cell shown in FIG. 25 will be described. The volatile dynamic memory cell portion 22 stores one-bit data in accordance with whether the node $N_{21}$ is charged to high level or held at low level without charging in response to signals from the word line and the bit line. First, the operation for transferring the data stored in the manner described above to the nonvolatile memory cell portion 22 will be described.

The voltages of the signal PGM and the power source $V_{H2}$ are set at low level (substantially at 0 V) and the voltage of the power source $V_{H1}$ is boosted from 0 V to about 20 V. By this operation, the transistor $Q_{95}$ is turned on and the transistor $Q_{96}$ is turned off. Accordingly, a voltage of about 20 V is applied to a series circuit of the capacitor $C_{91}$ and the tunnel capacitor $TC_{91}$. From the relationship of the magnitudes of the capacitances of the two capacitors, most of the voltage of about 20 V is applied across the two electrodes of the tunnel capacitor $TC_{91}$. As a result, electrons are injected by a tunnel effect to a node $FG_{91}$ connected to the gate of the transistor $Q_{93}$, and the node $FG_{91}$ is negatively charged. When the power source $V_{H1}$ is then decreased to 0 V, the transistor $Q_{95}$ is turned off and the node of the source of the transistor $Q_{95}$ and the drain of the transistor $Q_{96}$ is kept charged at about 20 V. Then, when the signal PGM is set at high level, if the node $N_{21}$ is at high level, the electrons mentioned above are extracted, so that one electrode of the capacitor $C_{91}$ is at low level. If the node $N_{21}$ is at low level, since the transistor $Q_C$ is turned off, the charging state of the electrons is maintained. In this state, when the voltage of the power source $V_{H2}$ is simultaneously boosted from 0 V to about 20 V, if the node $N_{21}$ is at high level, the voltage of one electrode (at the bulk side) of the capacitor $C_{91}$ is at 0 V, so that the voltage of the power source $V_{H2}$ is applied to a series circuit of the tunnel capacitor $TC_{91}$ and the capacitor $C_{91}$. Since the capacitance of the capacitor $C_{91}$ is sufficiently larger than that of the tunnel capacitor $TC_{91}$, most of the voltage is applied to the tunnel capacitor $TC_{91}$ so that a tunnel effect in the opposite direction to that mentioned earlier is caused. Electrons of the node $FG_{91}$ are extracted, and the node $FG_{91}$ is positively charged. If the node $N_{21}$ is at low level, since one electrode of the capacitor $C_{91}$ is kept at about 20 V, the node $FG_{91}$ is kept negatively charged. That is, when the node $N_{21}$ is at high level, the node $FG_{91}$ is positively charged, and when the node $N_{91}$ is at low level, the node $FG_{91}$ is negatively charged. The charges thus charged are held for a long period of time after the power source is cut off.

The data stored in the nonvolatile memory cell portion 22 is transferred to the volatile dynamic memory cell portion 11 in the following manner. When the node $FG_{91}$ is positively charged, the transistor $Q_{93}$ is also turned on. When the array recall signal $V_{RC}$ is at high level, the transistor $Q_{94}$ also is turned on, so that the power source voltage $V_{CC}$ is applied to the node $N_{21}$ to charge the capacitor of the dynamic memory cell, thereby setting the node $N_{21}$ at high level. When the node $FG_{91}$ is negatively charged, the transistor $Q_{93}$ is turned off, and the power source voltage $V_{CC}$ is not applied to the node $N_{21}$ even after the signal $V_{RC}$ is at high level. The capacitor of the dynamic memory cell is not charged, and the node $N_{21}$ is kept at low level.

In the sixteenth embodiment, the transistor $Q_C$ is commonly used as the switching transistor and as the capacitor portion (utilizing the capacitance of the gate) of the dynamic memory cell. However, the transistor $Q_C$ can be used only as a switching means and a separate capacitor can be added as indicated by a dotted line in FIG. 25.

The memory cell of the sixteenth embodiment requires a smaller number of constituent elements for the volatile memory cell portion compared with that of the fifteenth embodiment, thereby further simplifying the circuit configuration and decreasing the cell occupation area.

Figure 26:
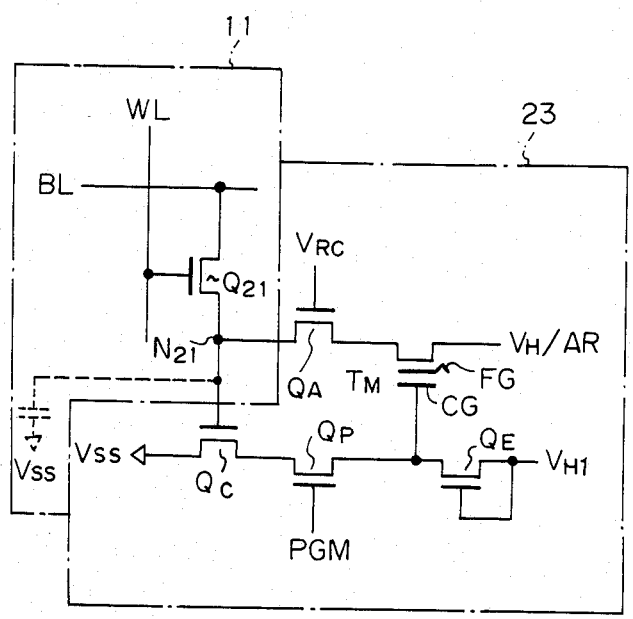
FIG. 26 shows a circuit diagram of a memory cell used in a semiconductor memory device according to a seventeenth embodiment of the present invention.

FIG. 26 shows a memory cell of a semiconductor memory device according to a seventeenth embodiment of the present invention. The memory cell comprises a volatile dynamic memory cell portion 11' and a nonvolatile memory cell portion 23. The volatile dynamic memory cell portion 11' consists of a MIS transistor $Q_{21}$ and a gate capacitance of a MIS transistor $Q_C$ as a capacitor portion. It is to be noted that a single capacitor also can be used, as indicated by a dotted line. The transfer gate transistor $Q_{21}$ is connected between a bit line BL and the gate of the transistor $Q_C$. The gate of the transistor $Q_{21}$ is connected to a word line WL. The source of the transistor $Q_C$ is connected to a power source $V_{SS}$ (normally 0 V) which is a common terminal side of the power source. The transistor $Q_C$ has both functions of the capacitor portion of the volatile dynamic memory cell portion 11' and a transistor of the nonvolatile memory cell portion 23, which is turned on or off in response to the memorized data in the capacitor portion. The connecting point of the transistor $Q_{21}$ and the gate of the transistor $Q_C$ is represented as a node $N_{21}$.

The nonvolatile memory cell portion 23 has, in addition to the transistor $Q_C$, a recall transistor $Q_A$, a transistor $Q_E$ serving as a diode means, a PGM transistor $Q_P$, and an EEPROM ($T_M$) as a nonvolatile memory cell transistor having a double gate structure. Each transistor is a MIS transistor.

A second write power source $V_H/AR$ which is capable of two-stage voltage switching is connected to the drain of the EEPROM. The source of the EEPROM is connected to the drain of the transistor $Q_A$. The source of the transistor $Q_A$ is connected to the node $N_{21}$ An array recall signal $V_{RC}$ is supplied to the gate of the transistor $Q_A$.

The first write power source $V_{H1}$, is connected to the drain and the gate of the transistor $Q_E$. The source of the transistor $Q_E$ is connected to the control gate CG of the EEPROM and the drain of the transistor $Q_P$, respectively. The gate of the transistor $Q_P$ receives a program signal PGM, and the source thereof is connected to the drain of the transistor $Q_P$.

Figure 27:
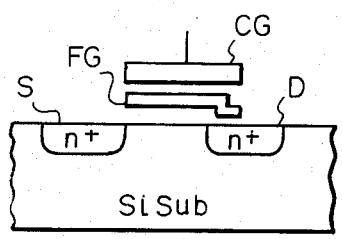
FIG. 27 shows a sectional view of an EEPROM (electrically erasable programmable read only memory) used in a memory cell in FIG. 26.
Figure 28:
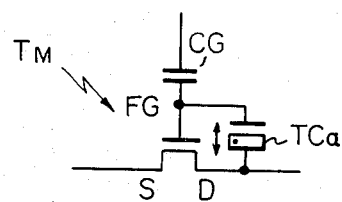
FIG. 28 shows an equivalent circuit diagram of an EEPROM in FIG. 27.

The operation of the memory cell described above will now be described. When the data is transferred from the volatile dynamic memory cell portion 11' to the data nonvolatile memory cell portion 23, the signals PGM and $V_{RC}$, and the power source voltage $V_H/AR$ are set at 0 V, and a power source voltage $V_{H1}$ is boosted from 0 V to about 20 V. The transistor $Q_E$ is turned on and the transistor $Q_P$ is cut off so that the control gate CG of the EEPROM is boosted to about 20 V. The EEPROM has the configuration shown in FIG. 27 and an equivalent circuit thereof is shown in FIG. 28. Therefore, when a voltage of about 20 V is applied between the control gate CG and a drain D, most of the voltage is applied between the floating gate FG and the drain D by capacitive coupling, since a capacitance between the control gate CG and a floating gate FG is sufficiently greater than the capacitance serving as a tunnel capacitor TCa between the floating gate FG and the drain D. This state serves as an erase state for the EEPROM. Electrons are injected in the floating gate FG to give it a negative charge. Thereafter, when the power source voltage $V_{H1}$ is decreased to 0 V, the transistor $Q_E$ is turned off and the charges of the control gate CG of the EEPROM are not discharged, so that the voltage of the control gate CG is held at about 20 V. When the signal PGM is set at high level under this state, the charges of the control gate CG described above flow to the power source $V_{SS}$ if the gate voltage of the transistor $Q_C$ is at high level, so that the voltage is decreased to 0 V. If the gate voltage of the transistor $Q_C$ is at low level, since the transistor $Q_C$ is OFF, the charges of the control gate CG do not change and the voltage is not decreased. In this state, when the power source voltage $V_H/AR$ is boosted from 0 V to about 20 V and when the gate of the transistor $Q_C$ is at low level, the voltage of the drain D of the EEPROM is kept at about 20 V, the voltage of the control gate CG is kept at about 20 V, and the EEPROM is kept erased. When the gate of the transistor $Q_C$ is at high level, the voltage of the drain of the EEPROM becomes about 20 V, the voltage of the control gate CG becomes 0 V, and the floating gate FG is positively charged, so that a write operation of the EEPROM is performed. As has been described above, the floating gate FG of the EEPROM is positively or negatively charged in accordance with the level of the node $N_{21}$ of the volatile dynamic memory cell portion 11', thereby holding the content of the dynamic memory cell.

When the content stored in the nonvolatile memory cell portion 23 is transferred to the volatile dynamic memory cell portion 11', i.e., in the case of an array recall, the following operation is performed. Namely, the power source voltage $V_{H1}$ and the signal PGM are set at low level (0 V), the signal $V_{RC}$ is set at high level (5 V), the power source voltage $V_H/AR$ is set at voltage $V_{CC}$ (5 V), and the word line is set at low level. When the floating gate FG of the EEPROM is positively charged, a voltage of 5 V from the power source $V_H/AR$ is supplied to the node $N_{21}$ through the drain and source of the EEPROM and the transistor $Q_A$ so as to charge the memory capacitor, thereby setting the memory capacitor at high level. When the floating gate FG of the EEPROM is negatively charged, the conduction state between the drain D and the source S of the EEPROM is not established, so that the capacitor consisting of the transistor $Q_C$ of the volatile memory cell portion 11' is not charged from the power source $V_H/AR$. In this manner, the data transferred to and stored in the nonvolatile memory cell portion 23 can be reproduced at the volatile dynamic cell portion 11'.

The EEPROM used in the nonvolatile memory cell portion 23 will be further described. As shown in FIG. 27, two n+-type regions are formed on a silicon substrate (SiSub) to be used as the drain D and a source S, respectively. Furthermore, the floating gate FG is formed between the control gate CG and the silicon substrate in addition to the control gate CG as the gate. A portion of the floating gate FG above the drain is insulated by a thin silicon oxide ($SiO_2$) film so as to cause a tunnel effect of the electrons therebetween. Therefore, the equivalent circuit of the EEPROM is as shown in FIG. 28.

In the circuit according to the embodiment of the present invention, the gate capacitance of the transistor $Q_C$ is utilized as the capacitor portion of the volatile dynamic memory cell portion 11' and no additional capacitor is used. However, a special capacitor as indicated by the dotted line in FIG. 26 can also be provided, thereby decreasing the device size by an area corresponding to the transistor $Q_C$. Although the transistor $Q_E$ is used as the diode element, another circuit having a function serving as the diode can be replaced.

According to the present embodiment, high integration of the nonvolatile memory device is allowed by decreasing the number of the circuit elements, and the number of the floating gate circuit elements to be used, such as a tunnel capacitor, can be decreased to one, thereby improving the manufacturing yield.

An eighteenth embodiment of the present invention will be described with reference to FIGS. 5, 29, and 30. The constitution of the circuit elements of this embodiment is same as that of the fourth embodiment.

Figure 29:
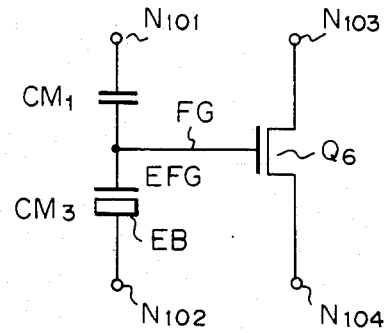
FIG. 29 shows a partial circuit diagram explaining the principle of a eighteenth embodiment of the present invention.

FIG. 29 is a circuit diagram explaining the principle of the present embodiment. Referring to FIG. 29, memorized data in a nonvolatile memory is transferred to a volatile memory portion upon on/off operation between nodes $N_{103}$ and $N_{104}$ when a floating gate section FG is charged. This nonvolatile data is obtained by the application of a high voltage across the electrodes of the tunnel capacitor to inject electrons. Electron injection to the floating gate FG or electron extraction therefrom is determined by whether or not a high voltage is applied to a node $N_{101}$ or $N_{102}$ in accordance with the state of the volatile memory portion. The capacitance of the auxiliary capacitor is far larger than that of the tunnel capacitor. Capacitive coupling or a charge trapping technique is used to apply a high voltage or 0 V to the node $N_{101}$ or $N_{102}$ in such a manner that a high DC voltage current will not flow (a steady current flows for at least 0.1 ms). In this manner, the high voltage is applied to the node $N_{101}$ or $N_{102}$ a plurality of times.

Figure 30:
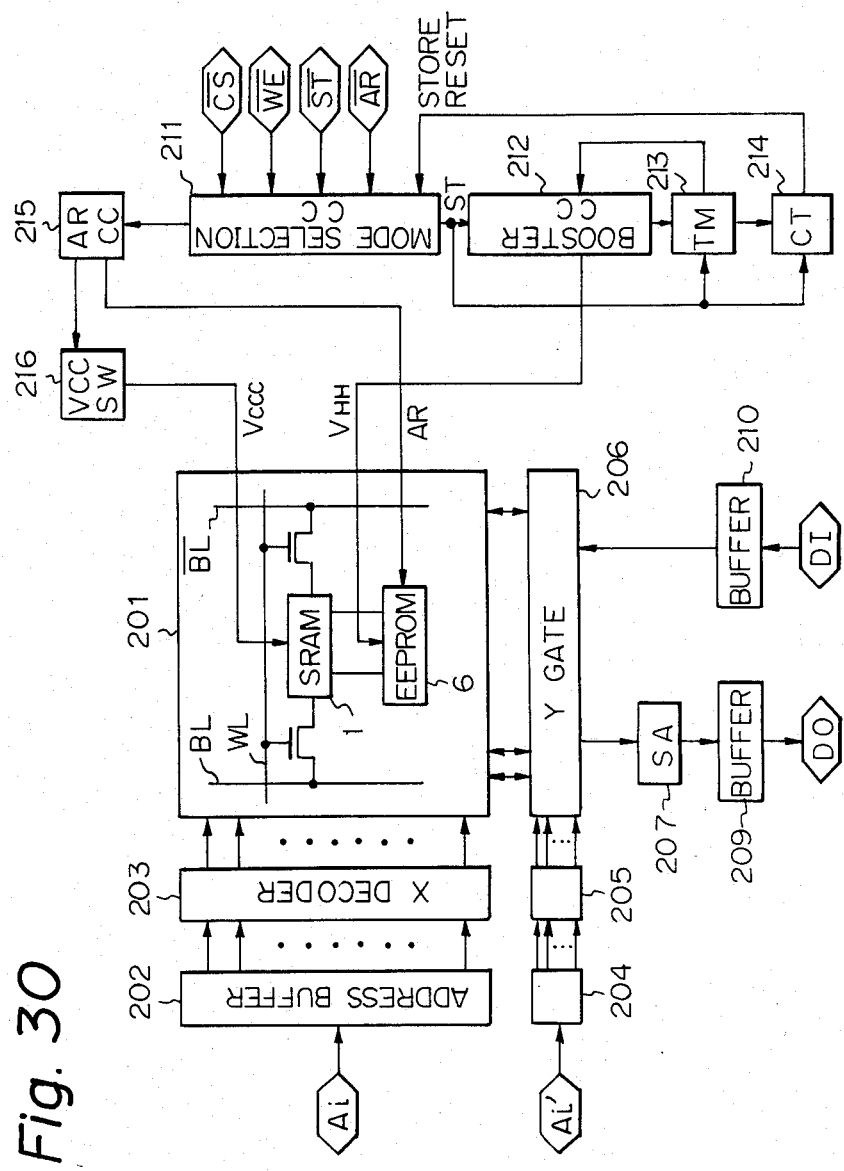
FIG. 30 shows a block circuit diagram of a semiconductor memory device as a whole according to an eighteenth embodiment of the present invention.

FIG. 30 is a block diagram showing the overall configuration of a semiconductor memory device including a nonvolatile semiconductor device according to an eighteenth embodiment of the present invention. Referring to FIG. 30, reference numeral 201 denotes a memory cell whose memory cells 1 and 6 in FIG. 5 are arranged at intersections of the word lines WL and bit line pairs BL and $\overline{BL}$. Reference numeral 202 denotes an address buffer for receiving an X address signal $A_i$ (i=0 to n); 203, an X decoder; 204, an address buffer for receiving a Y address signal $A_i'$ (i=0 to n); 205, a Y decoder; 206, a Y gate for selectively connecting a sense amplifier 207 from the volatile memory cell 1 (SRAM) to the memory cell 201 and a write enable circuit for connecting the SRAM to the memory cell 201; 209, an output buffer for output data DO; and 210, an input buffer for input data DI. Reference numeral 211 denotes a mode select circuit for receiving a chip select signal $\overline{CS}$, a write enable signal $\overline{WE}$ for the SRAM, a store signal $\overline{ST}$ for the EEPROM ($E^2$PROM), and the array recall signal $\overline{AR}$ for the EEPROM, and for selecting an operation mode.

More particularly, in the store mode (ST="1"), the mode select circuit 211 simultaneously renders a booster 212, a timer 213 and a counter 214 in an operative state. The booster 212 generates the voltage $V_{HH}$ of 20 to 25 V by using an internal clock. This voltage is applied to the nonvolatile memory cell 6 (EEPROM cell). In this case, the timer 213 is operated for a predetermined period of time (e.g., 5 msec). When the predetermined period of time has elapsed, the internal clock in the booster 212 is stopped to temporarily set the voltage $V_{HH}$ at 0 V. Thereafter, the booster 212 applies the voltage $V_{HH}$ of 20 to 25 V to the EEPROM cell 6 again. Repeat of the above operation is controlled by the counter 214. For example, when the counter 214 repeats the counting operation twice, it generates a store reset signal as a count-up signal. The store reset signal is supplied to the mode select circuit 211. As a result, the data store operation from the SRAM cell to the EEPROM is completed.

On the other hand, when the array recall signal AR is set at logic "1" (i.e., $\overline{AR}$="0"), a mode select recall circuit 215 is enabled. In this case, the array recall signal AR ($V_{RC}$) is supplied to the transistor $Q_8$ (FIG. 5) in the EEPROM cell 6, and the transistor $Q_8$ is turned on to drive a $V_{CC}$ switch 216. The $V_{CC}$ switch 216 temporarily decreases the voltage $V_{CCC}$ to 0 V and then increases the voltage $V_{CCC}$ to 5 V, thereby recalling the data from the EEPROM cell 6 to the SRAM cell 1. The thus controlled voltage $V_{CCC}$ is the power source voltage supplied to the SRAM cell 1, this is referred to as $V_{CC}$ in the preceeding figures for the sake of simplicity.

In the above embodiment, in the store mode (i.e., in the write mode of the EEPROM cell), the power source voltage $V_{HH}$ is applied twice for each ON time of 5 msec. However, the ON time may change, and the number of voltage applications may be 3 or more.

The memory modules $CM_1$ and $CM_3$ of the EEPROM cell 6 shown in FIG. 5 comprise a semiconductor substrate and a metal layer such as a poly-Si layer. The electrodes $E_1$ and $E_4$ comprise separate n-type impurity diffusion regions in a p--type semiconductor substrate. The floating gate is capacitively coupled, i.e., through an insulating film, on the n-type impurity diffusion regions. The electrodes $E_2$ and $E_5$ are electrically connected to each other and are also capacitively coupled on the n-type impurity diffusion regions. Therefore, when the data is stored from the SRAM cell 1 to the EEPROM cell 6, substantially the same voltage as the voltage $V_{HH}$ is applied to one of the electrodes $E_1$ and $E_4$. In this case, electrons are injected from the substrate to the n-type impurity diffusion regions as an electrode. That is, the potential at the electrode $E_1$ or $E_4$ is lowered over a period of time due to junction leakage. As a result, the voltage across the electrodes $E_4$ and $E_6$ is lowered at the time of storage, thereby impairing tunnel efficiency and decreasing the memory efficiency of the EEPROM. In addition, since the electrons are mobile between the electrodes $E_4$ and $E_6$, a voltage across the electrodes Ephd 4 and $E_6$ is lowered.

Figure 31:
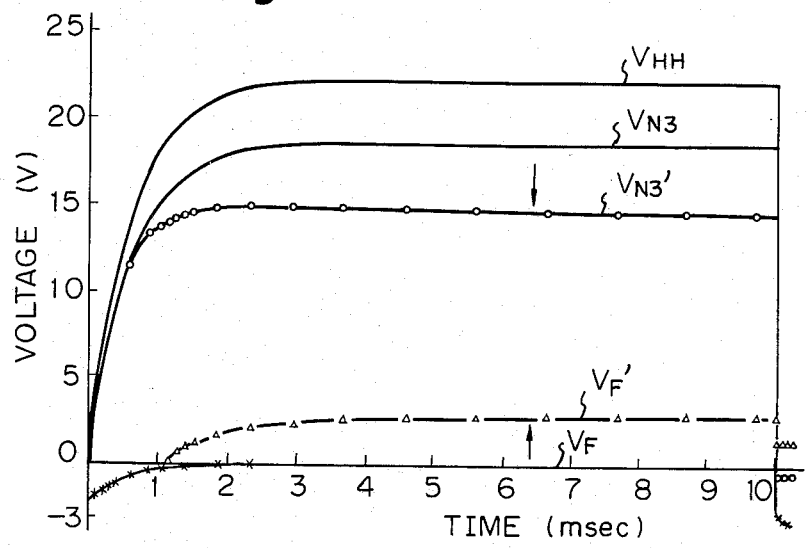
FIGS. 31 and 32 show graphs explaining the effect of the device in FIG. 30.
Figure 32:
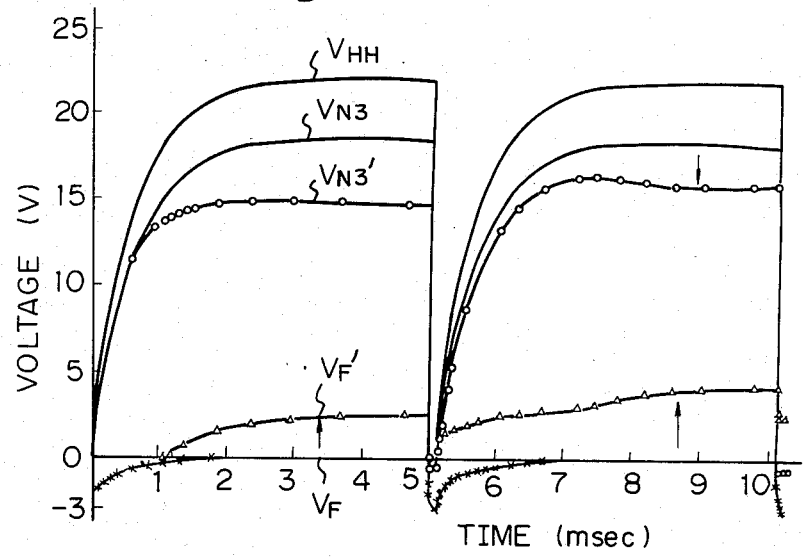

FIGS. 31 and 32 are graphs explaining the effect of the present embodiment. Referring to FIGS. 31 and 32, $V_{N3}$ and $V_{N3}'$ are potentials at the electrode $E_4$ when the transistor $Q_6$ shown in FIG. 5 is kept off. More specifically, the potential $V_{N3}$ is obtained when the tunnel phenomenon does not occur between the electrodes $E_4$ and $E_6$, while the potential $V_{N3}'$ is obtained when the tunnel phenomenon does occur. $V_F$ and $V_F'$ are potentials at the floating gate. In the same manner as described above, the potential $V_F$ is obtained when the tunnel phenomenon does not occur between the electrodes $E_4$ and $E_6$, while the potential $V_F'$ is obtained when the tunnel phenomenon does occur between the electrodes $E_4$ and $E_6$. As previously described, when the tunnel phenomenon occurs, the potential at the electrode $E_4$ is decreased from the potential $V_{N3}$ to $V_{N3}'$, while the potential at the floating gate increases from the potential $V_F$ to the potential $V_F'$ by a component corresponding to a decrease in the potential at the electrode $E_4$. For example, an initial potential at the floating gate is $-3$ V, while a potential at the floating gate increases to $+1.2$ V after the voltage $V_{HH}$ (22 V) is applied for 10 msec, thereby indicating that data updating is performed.

FIG. 32 is the graph showing the results according to the present embodiment. The voltage $V_{HH}$ P(22 V) is applied twice for each 5 msec. When the tunnel phenomenon occurs, the floating gate is set at a potential of about $+1$ V after the voltage $V_{HH}$ is applied for the first time. The floating gate is then set at a potential of $+2.6$ V after the voltage $V_{HH}$ is applied for the second time. As compared with the conventional nonvolatile RAM having a potential of $+1.2$ V shown in FIG. 31, the potential at the floating gate is greatly improved.

The effect also can be obtained of compensation for a decrease in $V_{N3}$ due to junction leakage occurring at the time of writing in the EEPROM. Therefore, the degradation of the tunnel efficiency of the EEPROM can be prevented to improve the memory efficiency of the EEPROM.

Figure 33:
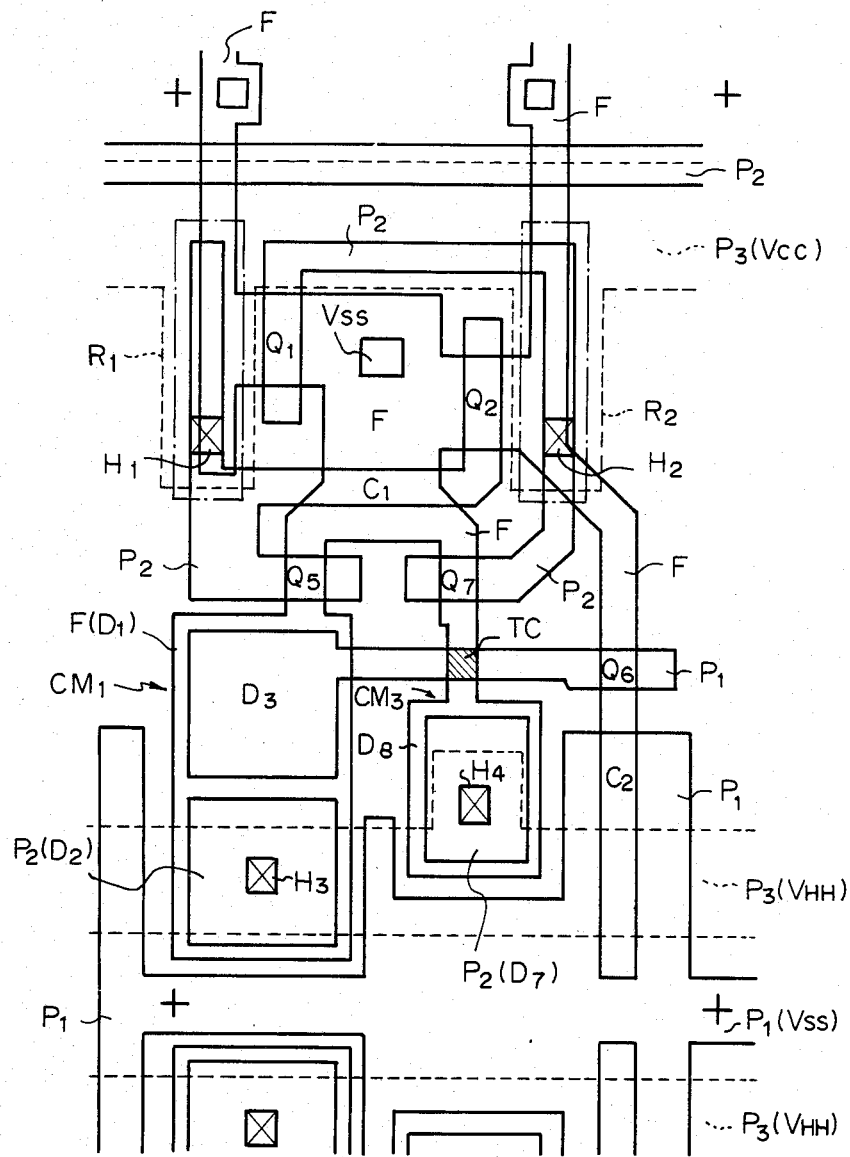
FIG. 33 shows a plan view of a pattern layout of the memory cell shown in FIG. 3 on the semiconductor substrate.

FIG. 33 shows a pattern layout of the memory cell shown in FIG. 3 on the semiconductor substrate. Referring to FIG. 33, the depletion-type load transistors $Q_3$ and $Q_4$ of the volatile memory cell portion 1 are replaced with poly-Si load resistors $R_1$ and $R_2$.

In FIG. 33, reference symbol F denotes a diffusion region such as a source or drain which is formed in the semiconductor substrate (not shown), reference symbols $P_1$, $P_2$ and $P_3$ denote first, second and third conductive layers, i.e., poly-Si layers, the third conductive layer $P_3$ is indicated by a dotted line, and contact portions between the conductive layer $P_3$ and the remaining conductive layers are designated by reference symbols $H_1$, $H_2$, and so on.

In the cell shown in FIG. 33, the load resistors $R_1$ and $R_2$ of the transistors $Q_1$ and $Q_2$ of the volatile memory cell portion 1 of the memory cell in FIG. 3 are formed by making a high-resistance conductive layer from conductive layer portions in the third layer extending from the power source $V_{CC}$ to the contact portions $H_1$ and $H_2$; the transistors $Q_1$ and $Q_2$ of the volatile memory cell portion and the transistors $Q_5$ and $Q_7$ of the nonvolatile memory cell portion 4 are formed by the diffusion region F and the second conductive layer $P_2$; the transistor $Q_6$ is formed by the diffusion region F and the first conductive layer $P_1$; the capacitor module $CM_1$ is formed by the diffusion region F and the first and second conductive layrs $P_1$ and $P_2$; and the capacitor module $CM_3$ is formed of the diffusion region F and the first and second conductive layers $P_1$ and $P_2$. In the tunnel capacitor TC constituted by the electrodes $D_8$ and $D_9$ of the capacitor module $CM_3$, the insulating film between the diffusion region F and the first conductive layer $P_1$ is as thin as 100 to 200 Å.

Figure 34:
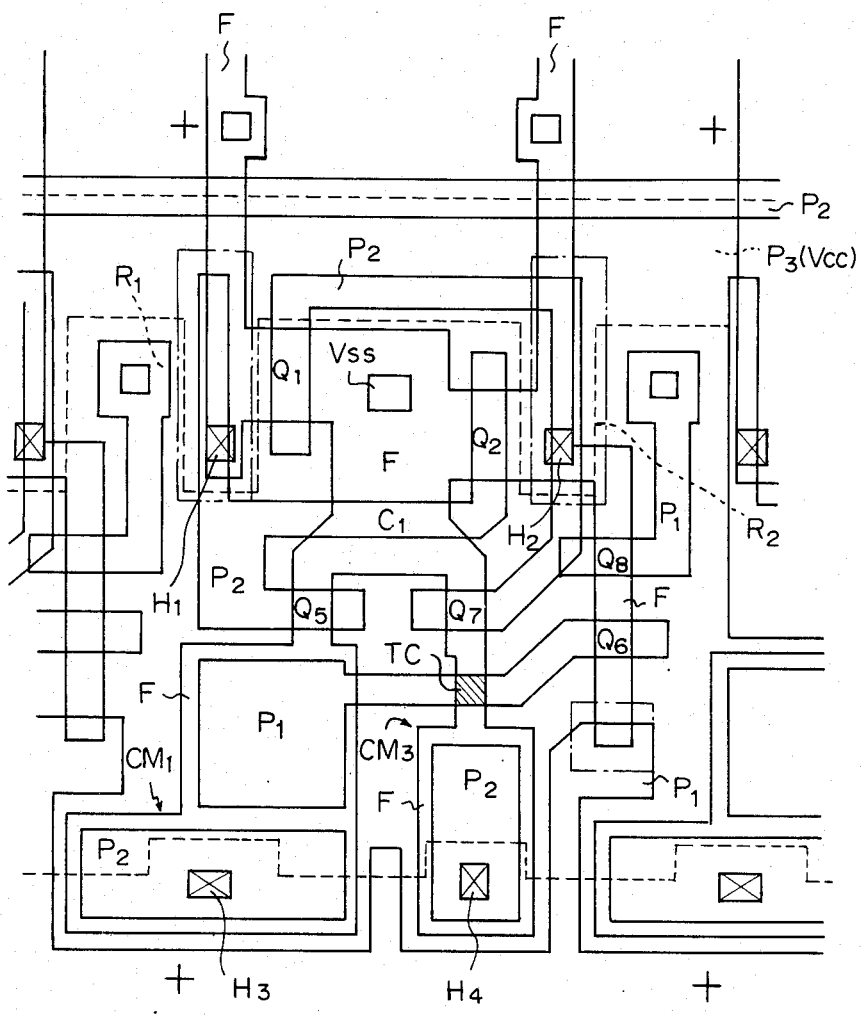
FIG. 34 shows a plan view of a pattern layout of the memory cell shown in FIG. 4 on the semiconductor substrate.

FIG. 34 shows a pattern layout of the memory cell shown in FIG. 4. In the layout shown in FIG. 34, the depletion-type load transistors $Q_3$ and $Q_4$ of the volatile memory cell portion 1 are replaced with load resistors $R_1$ and $R_2$ of poly-Si or the like. The respective conductive layers, the diffusion region, the contact portions, and the like are designated by the same reference numerals as those in FIG. 33. The remaining portions can be easily deduced from the description regarding FIG. 33, and a detailed description thereof will be omitted. In the layout shown in FIG. 34, since the recall capacitor $C_2$ is not included, the occupying area of the substrate per memory cell is smaller than the layout shown in FIG. 33.

I claim:

1. A semiconductor memory device comprising a volatile memory cell and a nonvolatile memory cell co-acting with the volatile memory cell, said nonvolatile memory cell comprising a transistor which has a floating gate and turns ON or OFF in response to data memorized in said nonvolatile memory cell, a single tunnel capacitor, one electrode of which is connected to the floating gate, a first write circuit connected to the other electrode of said tunnel capacitor, and a second write circuit capacitively coupled to said one electrode of said tunnel capacitor, either said first write circuit or said second write circuit supplying a current or a reverse current thereto across said tunnel capacitor, respectively, and supplying a voltage for writing to said tunnel capacitor in response to the data memorized in said volatile memory cell, and electrons being injected to or emitted from said floating gate.

2. A semiconductor memory device as set forth in claim 1, wherein said first write circuit comprises a first transistor, a first switch means for controlling the potential of the gate of said first transistor in response to the memorized data of said volatile memory cell; the other electrode of said tunnel capacitor is supplied with a high-voltage control power source through said first transistor; said second write circuit comprises a second transistor, and a second switch means for controlling the potential of the gate of said second transistor in response to the memorized data of said volatile memory cell; and said high-voltage control power source is capacitively coupled to said floating gate through said second transistor.

3. A semiconductor memory device as set forth in claim 1, wherein said first write circuit comprises a first capacitor and a first switch means, one electrode of said first capacitor is connected to the other electrode of said tunnel capacitor, the other electrode of said tunnel capacitor is supplied a voltage for writing in response to the memorized data of said volatile memory cell by said first switch means, a high-voltage control power source is connected to the other electrode of said first capacitor, said second write circuit comprises a second capacitor and a second switch means, one electrode of said second capacitor is coupled capacitively to said floating gate, the other electrode of said second capacitor is supplied with the high-voltage control power source, and a voltage for writing in response to the memorized data of said volatile memory cell is supplied to one electrode of said second capacitor by said second switch means.

4. A semiconductor memory device as set forth in claim 3, wherein said nonvolatile memory cell further comprises a transistor, and the drain of said transistor having said floating gate is connected to one of two data input/outut nodes through said recall transistor for recalling.

5. A semiconductor memory device as set forth in claim 4, wherein said recall transistor is turned on for a short period of time when data transfer is performed from said nonvolatile memory cell to said volatile, memory cell.

6. A semiconductor memory device as set forth in claim 3, wherein said nonvolatile memory cell further comprises a recall capacitor, the source of said transistor having said floating gate is connected to a power source through the recall capacitor, and the drain of said transistor is connected to one of two data input/output nodes of said volatile memory cell.

7. A semiconductor memory device as set forth in claim 3, wherein said volatile memory cell comprises a capacitor portion for storing the amount of charge corresponding to data to be memorized, a transfer transistor for transferring data memorized in said capacitor portion to bit lines, and another transistor, the gate of which is connected to said capacitor portion and which turns on or off in response to data memorized in said capacitor portion.

8. A semiconductor memory device as set forth in claim 7, wherein said second switch means includes a transistor and the gate capacitance of said transistor is used as said capacitor portion of said volatile memory cell.

9. A semiconductor memory device as set forth in claim 7, wherein a first high-voltage control power source is applied to said first write circuit, and a second high-voltage control power source having different timing from said first high voltage control power source is applied to said second write circuit.

10. A semiconductor memory device as set forth in claim 3, wherein said volatile memory cell comprises two transistors cross-connected to each other, the potentials of the gates of the two transistors are supplied to said nonvolatile memory cell as output of said volatile memory cell, and the output of said first switch means of said first write circuit is supplied to the gate of said second switch means of said second write circuit.

11. A semiconductor memory device as set forth in claim 3, wherein said volatile memory cell comprises two transistors cross-connected to each other, the potentials of the gates of said two transistors are supplied to said nonvolatile memory cell as output of said volatile memory cell, and the output of said second switch means of said second write circuit is supplied to the gate of said first switch means of said first write circuit.

12. A semiconductor memory device as set forth in claim 10 or 11, wherein said nonvolatile memory cell further comprises a recall capacitor, the source of said transistor having said floating gate in said nonvolatile memory cell is connected to a power source through the recall capacitor, and the drain of said transistor is connected to one of two data input/output nodes of said volatile memory cell.

13. A semiconductor memory device as set forth in claim 10 or 11, wherein said nonvolatile memory cell further comprises a recall transistor, and the drain of said transistor having said floating gate is connected to one of two input/output nodes through said recall transistor.

14. A semiconductor memory device as set forth in claim 13, wherein said recall transistor is turned on for a short period of time when data transfer is performed from said nonvolatile memory cell to said volatile memory cell.

15. A semiconductor memory device as set forth in claim 1 or 3, wherein a first high-voltage control power source is applied to said first write circuit, and a second high-voltage control power source having different timing from said first high voltage control power source is applied to said second write circuit.

16. A semiconductor memory device as set forth in claim 15, wherein, said nonvolatile memory cell further comprises a recall capacitor, the source of said transistor having said floating gate in said nonvolatile memory cell is connected to a power source through the recall capacitor, and the drain of said transistor is connected to one of two data input/output nodes of said, volatile memory cell.

17. A semiconductor memory device as set forth in claim 15, wherein said nonvolatile memory cell further comprises a recall transistor, and the drain of said transistor having said floating gate is connected to one of two input/output nodes through said recall transistor.

18. A semiconductor memory device as set forth in claim 17, wherein said recall transistor is turned on for a short period of time when data transfer is performed from said nonvolatile memory cell to said volatile memory cell.

19. A semiconductor memory device as set forth in claim 1, wherein said volatile memory cell comprises two transistors cross-connected to each other, the voltages of the gates of the two transistors are supplied to said nonvolatile memory cell as output of said volatile memory cell; said first write circuit comprises a diode means for receiving the voltage from a first high-voltage control power source and for supplying the same to the other electrode of said tunnel capacitor, a first switch means, and a program signal transistor; said first switch means controls the voltage of the other electrode of said tunnel capacitor through said program signal transistor in response to memorized data of said volatile memory cell; and a second high-voltage control power source is applied to said second write circuit.

20. A semiconductor memory device as set forth in claim 1, wherein said volatile memory cell comprises a capacitor portion for storing the amount of electric charge corresponding to data to be memorized, a transfer transistor for transferring data of said capacitor portion to a bit line, and another transistor, the gate of which is connected to said capacitor portion and which turns on or off in response to memorized data of said capacitor portion; a first high-voltage control power source and a second high-voltage control power source are supplied to said nonvolatile memory cell, said second high-voltage control power source is supplied to said first write circuit; said second write circuit comprises a transistor for receiving the voltage from said first high-voltage control power source, and a program signal transistor for relaying and controlling the voltage responding to the memorized data of said volatile memory cell; and the voltage from said first high-voltage control power source or the voltage responding to the memorized data of said volatile memory cell is supplied to said second write circuit as a writing voltage.

21. A semiconductor memory device as set forth in claim 7 or 20, wherein the gate capacitance of said transistor which turns on or off in response to the memorized data of said capacitor portion is used as said capacitor portion.

22. A semiconductor memory device as set forth in claim 1, wherein the write voltage of one of two input/output nodes is applied to said first write circuit and said second write circuit is applied a plurality of times.

23. A semiconductor memory device having a volatile memory cell and a nonvolatile memory cell coacting with said volatile memory cell, wherein said nonvolatile memory cell comprises a tunnel capacitor, one electrode of which is connected to a high-voltage control power source terminal, a first capacitor, one electrode of which is connected to the other electrode of said tunnel capacitor, a second capacitor connected between the other electrode of said first capacitor and said high-voltage control power source terminal, a transistor having a tunnel gate electrode, the gate of which is connected to a common node between tunnel capacitor and said first capacitor, and a switch means for controlling the potential at a common node said first capacitor and said second capacitor in response to data memorized in said volatile memory cell.

24. A semiconductor memory device having a volatile memory cell and a nonvolatile memory cell coacting with said volatile memory cell, wherein said nonvolatile memory cell comprises a capacitor unit consisting of two series-connected tunnel capacitors, a series circuit of a first capacitor and a depletion-type or enhancement-type transistor connected between the common node of said two tunnel capacitors and a high-voltage control power source terminal, a transistor, the gate of which is connected to said common node, and a switch means for controlling the potential of the gate of said depletion or enhancement-type transistor in response to data memorized in said volatile memory.

25. A semiconductor memory device, a memory cell of which comprises a pair of a volatile memory cell and a nonvolatile memory cell for saving the memorized data of said volatile memory cell, wherein said volatile memory cell comprises a capacitor portion for storing charges in response to data to be memorized, a transfer gate transistor connected between said capacitor and a bit line, a nonvolatile memory cell transistor having a double gate structure which has a control gate and a floating gate and in which electrons are injected by a tunnel effect, a recall transistor for transferring data stored in said nonvolatile memory cell transistor to said capacitor portion in response to a recall signal, a transistor turned on or off in response to the memorized data in said capacitor portion, a program signal transistor connected between said transistor turned on or off in response to the memorized data and said control gate, and a diode element connected to said control gate; a first write voltage is applied to said control gate through said diode element and a second write voltage is applied to the drain of said nonvolatile memory cell transistor, and said program signal transistor is in a conductive state, whereby data of said volatile memory cell is written into said nonvolatile memory cell.

* * * * *